United States Patent
Matsuda

[11] Patent Number: 6,037,245
[45] Date of Patent: Mar. 14, 2000

[54] HIGH-SPEED SEMICONDUCTOR DEVICE HAVING A DUAL-LAYER GATE STRUCTURE AND A FABRICATION PROCESS THEREOF

[75] Inventor: Hajime Matsuda, Nakakoma-gun, Japan

[73] Assignee: Fujitsu Quantum Devices Limited, Yamanashi, Japan

[21] Appl. No.: 09/340,193

[22] Filed: Jun. 28, 1999

[30] Foreign Application Priority Data

Jun. 30, 1998 [JP] Japan ................................. 10-185142

[51] Int. Cl.$^7$ ............................................. H01L 21/3205
[52] U.S. Cl. ..................... 438/586; 438/597; 438/638; 438/640; 438/668; 438/670; 438/671; 438/672; 438/673; 438/675
[58] Field of Search .................................. 438/585, 586, 438/597, 637, 638, 640, 666, 668, 670, 671, 672, 673, 675

[56] References Cited

FOREIGN PATENT DOCUMENTS 1-184958  7/1999  Japan .

*Primary Examiner*—Joni Chang
*Assistant Examiner*—Long Pham
*Attorney, Agent, or Firm*—Armstrong, Westerman Hattori, McLeland & Naughton

[57] ABSTRACT

A fabricating process of a semiconductor device includes the steps of forming a first photoresist layer on a surface of a substrate so as to cover a gate electrode on the substrate, forming a second photoresist layer on the fist photoresist layer with an increased sensitivity, forming a third photoresist layer on the second photoresist layer with a reduced sensitivity, forming an opening in a photoresist structure thus formed of the first through third photoresist layers such that the opening exposes the gate electrode and such that the opening has a diameter that increases gradually from the first photoresist layer to the second photoresist layer. Further, a low-resistance metal layer is deposited on the photoresist structure including the opening, such that the metal layer forms a low-resistance electrode on the gate electrode.

12 Claims, 23 Drawing Sheets

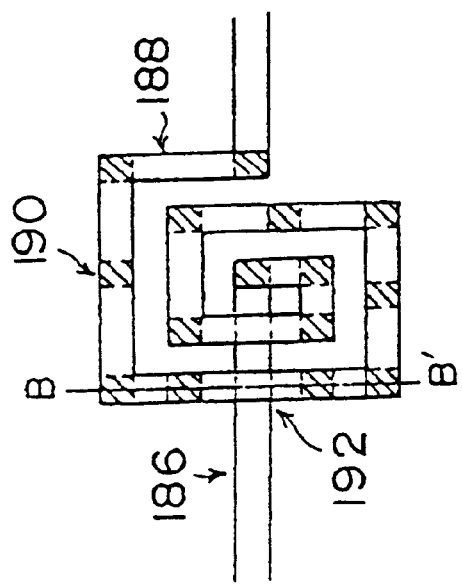
FIG. 10A
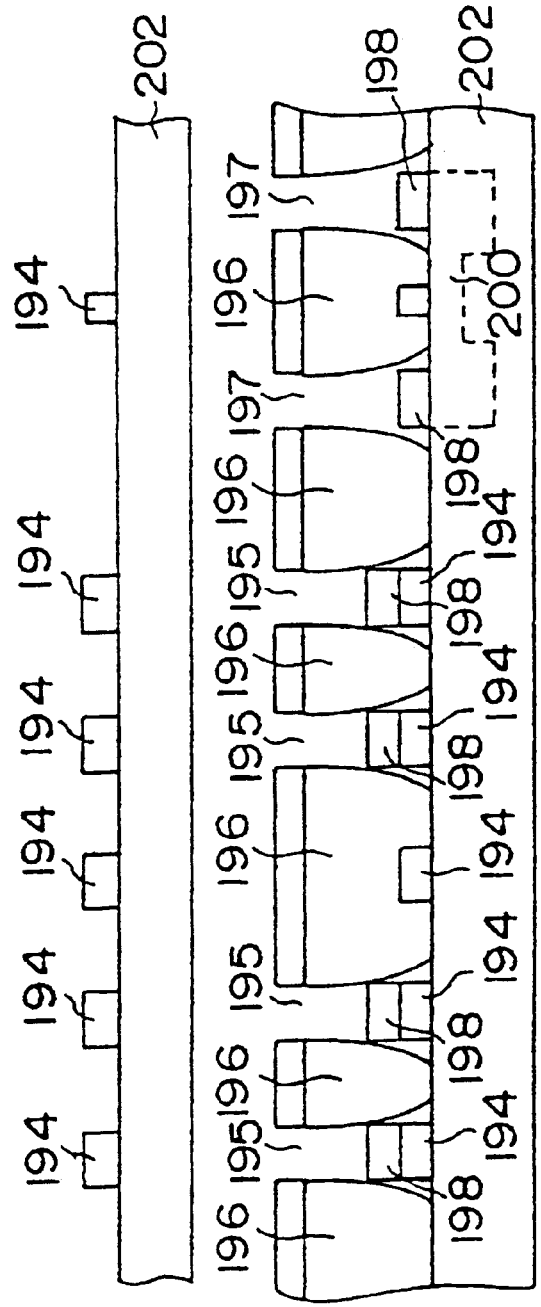
FIG. 10B
FIG. 10C

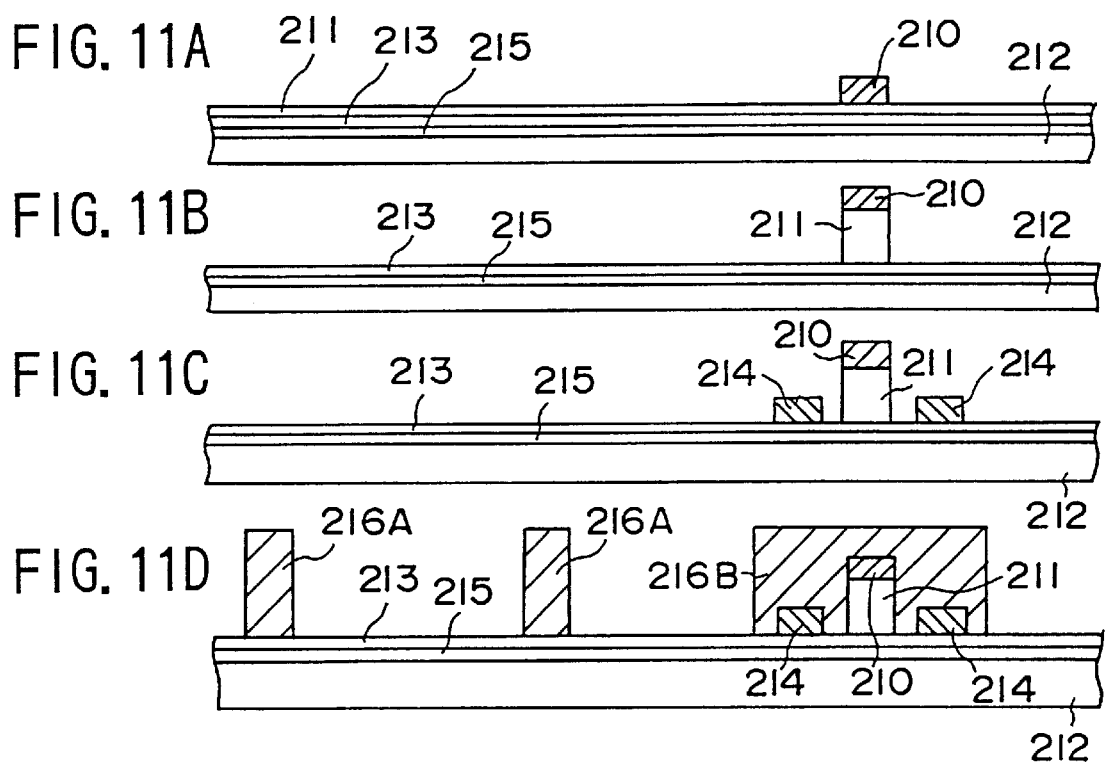

HIGH-SPEED SEMICONDUCTOR DEVICE HAVING A DUAL-LAYER GATE STRUCTURE AND A FABRICATION PROCESS THEREOF

BACKGROUND OF THE INVENTION

The present invention generally relates to semiconductor devices and more particularly to a high-speed semiconductor device having a dual-layer gate structure and a fabrication process thereof. Further, the present invention relates to fabrication of an air-bridge structure.

A compound semiconductor device having a gate electrode of a refractory metal has an advantageous feature of high operational speed and is used extensively in compound semiconductor integrated circuits for use in ultra-high frequency applications such as a GaAs gate array or a mobile telephony device. A representative example of the mobile telephony device includes portable telephones. Further, such a compound semiconductor device is advantageous in that the diffusion region can be formed relatively easily by a self-alignment process. Further, the feature of using a refractory metal for the gate electrode is advantageous in conducting a thermal diffusion process for forming a diffusion region.

Meanwhile, with the development of telecommunication technology, the analog devices and digital devices used in such ultra-high frequency applications are required to have the feature of higher operational speed and lower power consumption.

The desired increase of the operational speed is most conveniently achieved by reducing the gate length of the compound semiconductor device. On the other hand, such a decrease of gate length invites the problem of increase in the gate resistance as a result of the decrease of the cross-sectional area of the gate electrode associated with the device miniaturization. While it is generally practiced in the art to use a refractory metal silicide such as WSi for the material of the gate electrode in view of high-quality Schottky contact formed between the refractory metal silicide and a compound semiconductor substrate and further in view of the refractory nature of the refractory metal silicide, it is nevertheless desired to reduce the resistivity of the refractory metal silicide gate electrode further. It should be noted that WSi has a relatively large resistivity of about $2 \times 10^{-4}$ $\Omega \cdot cm$. A similar situation holds also in other silicides of refractory elements. Further, in such a high-speed semiconductor device having a reduced gate length, it is desired to employ the so-called LDD structure for suppressing the problem of short channel effect.

In order to reduce the gate resistance, there is a proposal to form the gate structure so as to have an overhang structure. According to this approach, the gate electrode has a dual-layer structure including a Schottky contact layer and a low-resistance layer formed thereon, wherein the lateral size of the low-resistance layer is increased as compared with the lateral size of the Schottky contact layer for minimizing the overall resistance of the gate electrode. The low-resistance layer may be formed for example by forming a layer of a low-resistance metal on the Schottky electrode, typically of WSi, after a thermal annealing process such as a diffusion process to form a diffusion region.

In the case of a compound semiconductor device such as a MESFET in which the diffusion region is formed by a self-alignment process, which uses the gate electrode as a mask, it is necessary to form the foregoing low-resistance layer after the step of forming the diffusion region by an ion implantation process is completed. By forming the low-resistance layer after the thermal annealing process, it becomes possible to use a low-melting metal of low resistance such as Au for the low-resistance layer. On the other hand, such a process has a drawback in that the number of steps for forming the gate structure is increased substantially as compared with the case of forming a conventional single-gate structure.

FIGS. 1A–1I show a conventional fabrication process of a MESFET having a dual-layer gate structure.

Referring to FIG. 1A, there is formed a channel layer 12 on the surface of a semi-insulating GaAs substrate by an ion implantation process of $Si^+$, and a gate electrode 10 of WSi is formed thereon by a deposition and patterning of a WSi layer. Further, an ion implantation process of $Si^+$ is conducted into the substrate 18 while using the gate electrode 10 as a mask, to form a diffusion region 14 of the $n^-$-type.

Next, a side wall oxide film is formed on a side wall of the gate electrode 10 thus formed, and the ion implantation process of $Si^+$ is conducted again, while using the gate electrode 10 and the side wall oxide film as a mask. By conducting a thermal annealing process on the structure thus obtained, an LDD (lightly doped drain) structure, which is essential for a miniaturized, high-speed MESFET is obtained.

Next, in the step of FIG. 1B, a photoresist layer 20 is applied on the substrate 18 on which the gate electrode 10 is formed as noted already.

Next, in the step of FIG. 1C, the photoresist layer 20 is etched back by a dry etching process or an ashing process such that the top surface of the gate electrode 10 is exposed.

Next, in the step of FIG. 1D, another photoresist layer 22 is formed on the photoresist layer 20 thus etched back by a spin coating process, followed by a patterning process to form an opening 26 in the photoresist layer 22. Further, a metal layer 24 of low-resistance is deposited on the structure thus formed such that the metal layer 24 covers the photoresist layer 22 and the bottom part of the opening 26, which includes the gate electrode 10.

Next, in the step of FIG. 1E, the photoresist layer 20 and the photoresist layer 22 are lifted off together with the metal layer 24 on the photoresist layer 22, and a gate structure carrying the low-resistance metal layer 24 on the gate electrode 10 in the form of an overhang structure is obtained.

Next, in the step of FIG. 1F, an SiN film 28 is deposited on the structure of FIG. 1E as a passivation film, wherein the deposition of the SiN passivation film 28 is conducted by a CVD process such that the passivation film 28 covers a bottom side of the low-resistance overhang structure 24.

Next, in the step of FIG. 1G, a photoresist layer 30 is deposited on the structure of FIG. 1F, followed by a patterning process thereof to form openings 30A and 30B exposing a part of the passivation film 28 covering the substrate 18 on which an ohmic electrode is to be formed. After applying a dry etching process to the exposed part of the passivation film 28 to expose the substrate 18 in correspondence to the openings 30A and 30B, a metal layer 32 making an ohmic contact with the substrate 18 is deposited on the photoresist layer 30 including the exposed part of the substrate 18 by a vacuum evaporation process.

Next, in the step of FIG. 1H, the photoresist pattern 30 thus formed and the metal layer 32 thereon are lifted off, leaving an ohmic electrode on the substrate 18 in correspondence to the foregoing openings 30A and 30B. Hereinafter, the ohmic electrode thus formed will be designated by the reference numeral 32.

Finally, in the step of FIG. 1I, another passivation film 34 is deposited on the structure of FIG. 1H so as to protect the surface of the ohmic electrode 32.

As will be understood from the explanation above, the foregoing conventional process that uses an etch-back process includes a number of steps and the semiconductor device becomes inevitably expensive.

In the fabrication process of FIGS. 1A–1I, there arise also various problems associated with the use of the etch-back process.

One of the problems is the control of the thickness of the photoresist layer 20 after the etch-back process in the step of FIG. 1C. When the etch-back process proceeds excessively after the exposure of the gate electrode 10, the gate electrode itself is etched unwantedly and the thickness or height of the gate electrode 10 may be diminished. When this occurs, the distance between the substrate 18 and the low-resistance layer 24 of the gate electrode structure is decreased, and the stray capacitance of the gate structure increases inevitably. In such a structure in which the distance between the low-resistance layer 24 and the substrate 18 is small, the rate of deposition of the passivation film 28 at the bottom part of the low-resistance layer 24 forming the overhang structure is generally reduced due to the difficulty in the gaseous source materials to be transported into such a small space formed between the substrate surface and the overhang structure of the low-resistance layer 24. As a result of the reduced deposition rate, the passivation film 28 may have a reduced thickness at the bottom side of the low-resistance layer 24. When the thickness of the passivation film 28 is thus reduced, there is a substantial risk that the passivation film 28 does not function as an effective protection layer.

Another problem associated with the fabrication process of the dual-layer gate electrode explained above with reference to FIGS. 1A–1I is that, due to the ionic nature of Ga and As and associated piezoelectricity of the substrate 18 formed of GaAs, the substrate 18, which is under a stressed condition by the gate electrode 10 and the passivation film 28, may accumulate piezoelectric charges underneath the gate electrode 10. The polarity of the piezoelectric charges changes depending on the elongating direction of the gate electrode 10 with respect to the crystal orientation of the GaAs crystal forming the substrate 18. When such piezoelectric charges are induced in the substrate 18 underneath the gate electrode 10, the threshold level of the MESFET is changed accordingly, and it becomes difficult to maintain the threshold voltage of the MESFET uniformly throughout the wafer on which the MESFET is formed together with other similar MESFETs. In such a case, the operational characteristic of the IC chips obtained from a common substrate or wafer, which may be a DCFL (direct-coupled FET logic), variates variously depending on the chip.

Further, the foregoing process of FIGS. 1A–1I relying upon the etch-back process of the photoresist layer 20 suffers from the problem of variation in the thickness of the photoresist layer 20 within the wafer constituting the substrate 18. When this occurs, the thickness of the passivation film 20 underneath the overhang structure formed by the low-resistance layer 24 changes variously and the threshold voltage of the MESFET may vary within the same wafer used for the substrate 18.

It should be noted that such a variation in the thickness of the photoresist layer 20 means that the degree of planarization is degraded in the photoresist layer 20, wherein such a degradation in the planarization is caused as a result of the etch-back process. Generally, it is known that the thickness of a photoresist layer covering a gate structure changes depending on the area of the pattern forming the gate structure. When the pattern of the gate structure has a large area, the photoresist layer covering such a gate structure has a thickness generally the same as the thickness of the photoresist layer formed on a flat surface. When the size of the gate pattern is reduced to the order of submicrons or sub-quarter microns, on the other hand, it is known that the thickness of the photoresist layer tends to become smaller in the part covering the gate electrode pattern than in the part formed on a flat surface. This means that the amount of the etch-back process for exposing the gate electrode 10 of FIG. 1C has to be adjusted depending on the area of the gate electrode patterns that are covered by the photoresist layer 20, while such an adjustment of the etch-back process is difficult.

Further, in the foregoing process of FIGS. 1A–1I, it is desired to cover the structure of FIG. 1A including the gate electrode 10 by a passivation film not shown so as to protect the substrate surface from a damage caused by a dry etching process used in the various steps of the fabrication process of the MESFET. On the other hand, such a passivation film, covering the gate electrode 10, has to be removed after the etch-back process of the photoresist layer 20 by a dry etching process. When there is no sufficient selectivity or difference in the etching rate between the photoresist layer and the passivation film in the foregoing dry etching process of the passivation film, the thickness of the photoresist layer is reduced inevitably as a result of the dry etching process conducted so as to remove the passivation film from the top surface of the gate electrode 10. When there exists such a difference in the etching rate, it becomes difficult to control the dry etching process. Because of this, the process of FIGS. 1A–1I has suffered from the problem of limited degree of freedom in setting the process condition.

Further, there is a proposal to form the T-shaped gate electrode to have a dual-layer structure without using the etch-back process as disclosed in the Japanese Laid-Open Patent Publication 01-184958.

According to the process of this prior art, a resist layer having a dual-layer structure is provided on a substrate after the step of forming a Schottky gate electrode on the substrate such that the dual-layer resist covers the Schottky gate electrode. The dual-layer resist includes a first layer of high sensitivity and a second layer of low sensitivity formed on the first layer, and the dual-layer resist thus formed is subjected to a controlled exposure process while using a photomask formed with a mask window smaller in size than the size or length of the Schottky gate electrode. As a result of a development process that follows the exposure process, the dual-layer resist is dissolved until the top part of the gate electrode is exposed, wherein it should be noted that the first layer resist having a higher sensitivity dissolves faster in the lateral direction in the development process in the exposed part as compared with the second layer resist, resulting in an inversely tapered cross-sectional structure for the resist opening formed in the dual-layer resist. Such a resist opening, characterized by the size which is larger in the central part than in the top part, is advantageous for conducting a lift-off process of the resist by using an organic solvent.

In the foregoing prior art, it should be noted that the exposure dose and the developing time are controlled carefully such that the resist opening thus formed has a reduced lateral size in the bottom part thereof corresponding to the lower photoresist layer, such that the resist opening exposes only the top part of the gate electrode. More specifically, the exposure dose has to be controlled such that the bottom part of the lower photoresist layer of high sensitivity is not substantially exposed. Further, the development process has to be controlled such that the bottom part of the lower photoresist layer, in which the Schottky gate electrode is embedded, is not dissolved.

After the development process of the foregoing dual-layer resist to form the resist opening, a low-resistance metal such as Au is deposited on the Schottky gate electrode by an evaporation deposition process, to form the desired T-shaped dual-layer gate structure including the Schottky gate electrode and a low-resistance layer formed thereon. After the formation of the dual-layer gate structure, the dual-layer resist is lifted off together with the low-resistance metal deposited thereon, leaving behind the T-shaped dual-layer gate structure on the substrate.

In the foregoing prior art process of the Japanese Laid-Open Patent Publication 01-184958, it is necessary to use a photomask having a window with a width narrower than the size of the lower electrode that defines the gate length of the device for the exposure process, while it should be noted that the approach of using such a photomask cannot reduce the size of the resist opening in conformity with the gate electrode of the reduced gate length. As noted previously, the lower photoresist layer has a high sensitivity and is exposed by a very small amount of incident optical beam. Thereby, the lower photoresist layer is dissolved rapidly at the time of the development process, and thus, there appears a tendency that the substrate surface is exposed at both sides of the gate electrode of the minute gate length. In fact, it is necessary to use a zero width for the mask window in order to form the gate electrode with a gate length of 0.2 $\mu$m, while the use of such a photomask having a zero-width window is unrealistic. Even if a mask window of 0.15 $\mu$m or less can be formed successfully in the photomask by a high-resolution exposure process such as an electron beam exposure process, the resist structure thus formed has a very minute resist opening in the upper photoresist layer, and the formation of the desired T-shaped gate structure through such a resist structure becomes difficult.

Meanwhile, a GaAs analog integrated circuit is generally formed to construct a so-called MMIC (microwave monolithic integrated circuit), in which active devices such as FET are integrated on a common substrate together with conduction strips, diodes, resistors, capacitors and inductances, for facilitating operation at a microwave band. In order to increase the operational frequency of such an MMIC further, it is necessary to minimize the stay capacitance associated with the conduction strips.

In order to minimize the stray capacitance of a conduction strip, there is a proposal to form an air bridge structure in which the conduction strip extends over the substrate with a separation therefrom by a space or void. In such an air bridge structure, in which an insulation film, which is otherwise provided between the conduction strip and the substrate, is replaced by an air having a minimum dielectric constant, the stray capacitance associated with a conductor strip is minimized and the high frequency operation of the integrated circuit is facilitated.

FIGS. 2A–2I show a conventional process of forming an air bridge structure.

Referring to FIG. 2A, a resist pattern not illustrated is formed on a substrate, followed by a lift-off process, to form a lower electrode 38.

Next, in the step of FIG. 2B, a photoresist layer is applied on the structure of FIG. 2A, followed by a patterning process, to form a photoresist pattern 40 having openings 41.

Next, in the step of FIG. 2C, an exposure process is conducted on the photoresist pattern 40 by a ultraviolet irradiation, followed a thermal annealing process to induce a curing in the photoresist pattern 40, and a step of FIG. 2D is conducted in which a metal layer 42 is deposited on the resist pattern 40 thus cured in the step of FIG. 2C by a sputtering process. As a result of the annealing process conducted in the step of FIG. 2C, the photoresist pattern 40 is deformed to have an arcuate curved surface.

Next, in the step of FIG. 2E, a photoresist pattern 44 is provided on the structure of FIG. 2D with a resist window such that the resist window exposes a part of the metal layer 42 in which an air bridge structure is to be formed. Further, an electroplating process is conducted in FIG. 2F in which a thick wiring pattern layer 46 is formed on the metal layer 42 in correspondence to the resist window exposing the metal layer 42, while using the metal layer 42 as an electrode.

Next, in the step of FIG. 2G, the resist pattern 44 is removed by an ashing process, and the part of the metal layer 42 not covered by the thick wiring pattern layer 46 is removed by an ion milling process. Further, the resist pattern 40 remaining under the thick wiring pattern layer 46 is dissolved in the step of FIG. 2I, and the desired air bridge structure is obtained by the remaining wiring pattern layer 46.

There is also a proposal in the Japanese Laid-Open Patent Publication 3-126247 to form an air bridge structure by a more simple process. According to this simplified process, a lower wiring layer is formed on a substrate, and a pillar structure is formed on the lower wiring layer thus formed so as to support an upper wiring layer. Further, a photoresist layer is provided so as to cover the lower wiring layer and the pillar structure and a groove is formed in the photoresist layer by an image reversal process such that the upper part of the pillar structure is exposed. Further, a metal layer having a width smaller than the depth of the foregoing groove is deposited on the structure thus formed, followed by a lift-off process to form a wiring pattern. Simultaneously to the lift-off of the resist layer, there is formed a space underneath the wiring pattern and the desired air bridge structure is obtained.

In the conventional fabrication process of the air bridge structure of FIGS. 2A–2I, there arises a problem, when depositing the metal layer 42 on the cured photoresist pattern in the step of FIG. 2D as the electrode layer of the electroplating process, in that the deposition of the metal layer 42 may induce a formation of winkles in the cured photoresist pattern 40. It should be noted that the optimum condition of the thermal annealing process for curing a photoresist changes slightly depending on the nature of the photoresist. In the case the curing of the resist pattern 40 is not sufficient, there is a substantial risk that the deposition of the metal layer 42 induces a winkle formation in the resist pattern 40 as a result of the stress caused by the deposited film. When such a winkle is caused, the air bridge structure may be deformed. On the other hand, excessive curing of the resist pattern 40 tends to cause an incomplete removal in the last step of FIG. 2I. The process window for curing the resist pattern 40 is thus substantially limited.

Another problem associated with the foregoing process of FIGS. 2A–2I is that the photoresist pattern 40, thus changed the shape to have the arcuate structure, may have an insufficient mechanical strength for supporting the air bridge structure. In this case, the air bridge structure formed on the photoresist pattern 40 undergoes a deformation, and the conductor strip may not perform as desired or as designed.

Further, the foregoing process of FIGS. 2A–2I includes a large number of steps not preferable in view of reducing the cost of the semiconductor device.

SUMMARY OF THE INVENTION

Accordingly, it is a general object of the present invention to provide a novel and useful semiconductor device and a fabrication process thereof wherein the foregoing problems are eliminated.

Another object of the present invention is to provide a method of fabricating a semiconductor device, comprising the steps of:

applying a first photoresist layer on a surface of a substrate so as to cover a gate electrode formed on said surface of said substrate;

applying a second photoresist layer on said fist photoresist layer;

applying a third photoresist layer on said second photoresist layer;

forming an opening in a photoresist structure formed of said first through third photoresist layers such that said opening penetrates through said second and third photoresist layers, such that said opening has a diameter that increases gradually from said third photoresist layer to said second photoresist layer, such that said diameter of said opening increases gradually form said first photoresist layer to said second photoresist layer, and such that said opening exposes a top surface of said gate electrode; and depositing a metal layer having a resistance smaller than a resistance of said gate electrode on said photoresist structure so as to include said opening, said step of providing said first photoresist layer being conducted such that said first photoresist layer covers said surface of said substrate in an intimate contact with a side wall of said gate electrode.

According to the present invention, the metal layer deposited on the gate electrode forms a Y-shaped low-resistance layer after lifting off the resist structure. By forming the second photoresist layer to have a sensitivity larger than any of the first and third photoresist layers, the opening formed in the photoresist structure has an increased lateral size in the second photoresist layer, and the Y-shaped, low resistance gate electrode structure is obtained with reliability.

Another object of the present invention is to provide a method of fabricating a semiconductor device, comprising the steps of:

providing an insulation film on a surface of a substrate so as to cover a first conductor pattern formed on said surface of said substrate;

applying a first photoresist layer on said surface of a substrate so as to cover said first conductor pattern;

applying a second photoresist layer on said fist photoresist layer;

applying a third photoresist layer on said second photoresist layer;

forming an opening in a photoresist structure formed of said first through third photoresist layers such that said opening penetrates through said second and third photoresist layers, such that said opening has a diameter that increases gradually from said third photoresist layer to said second photoresist layer, such that said diameter of said opening increases gradually from said first photoresist layer to said second photoresist layer, and such that said opening exposes a top surface of said first conductor pattern; and depositing a metal layer having a resistance smaller than a resistance of said first conductor pattern on said photoresist structure so as to include said opening, such that said metal layer forms a second conductor pattern, said step of providing said first photoresist layer being conducted such that said first photoresist layer covers said surface of said substrate in an intimate contact with a side wall of said first conductor pattern.

Another object of the present invention provides a semiconductor device, comprising:

a substrate;

a first conductor pattern formed on a surface of said substrate; and a second conductor pattern formed on said first conductor pattern, said second conductor pattern being defined by a flat top surface.

According to the present invention, the second conductor pattern deposited on the first conductor pattern forms an air bridge structure of low resistance after the lifting off of the resist structure. The air bridge structure thus formed has the feature of flat top surface. Thereby, the problem associated with the conventional air bridge structure in that the shape of the resist pattern, on which the air bridge structure is formed, is changed as a result of the thermal annealing process of the resist pattern, is effectively eliminated, and the air bridge structure is formed with reliability.

Other objects and further features of the present invention will become apparent from the following detailed description when read in conjunction with attached drawings.

BRIEF DESCRIPTION OF THE DRAWINGS

FIGS. 10A–10F are diagrams showing the fabrication process of a semiconductor device according to a seventh embodiment of the present invention;

FIGS. 11A–11H are diagrams showing the fabrication process of a semiconductor device according to an eighth embodiment of the present invention.

DETAILED DESCRIPTION OF THE PREFERRED EMBODIMENTS

[PRINCIPLE]

FIGS. 3A–3G show the principle of the present invention.

Figure 1A:
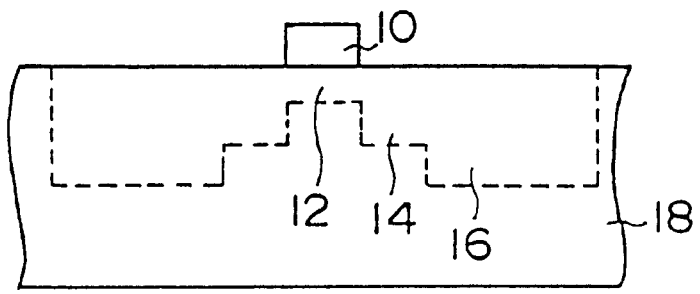
FIGS. 1A–1I are diagrams showing the fabrication process of a conventional semiconductor device.
Figure 1B:
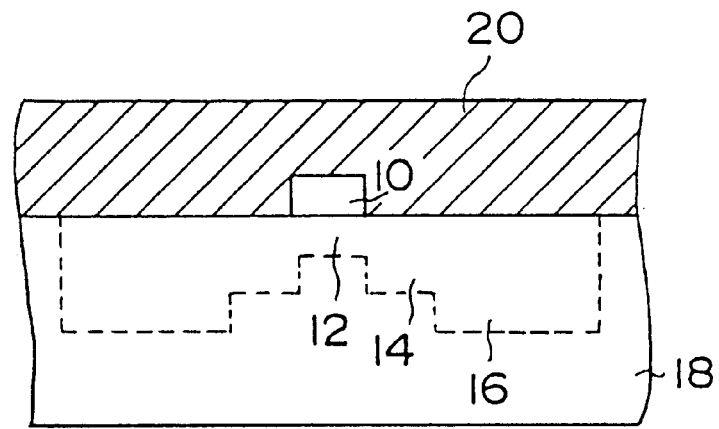
Figure 1C:
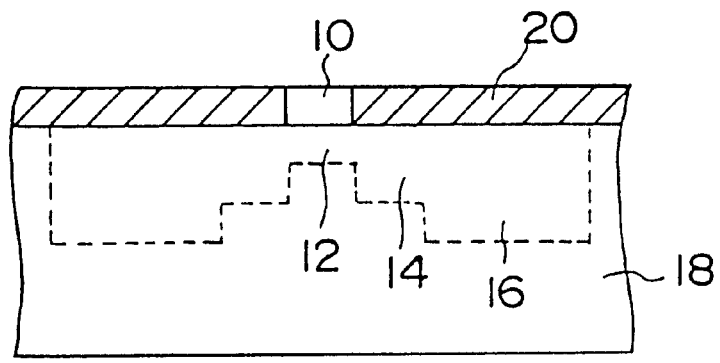
Figure 1D:
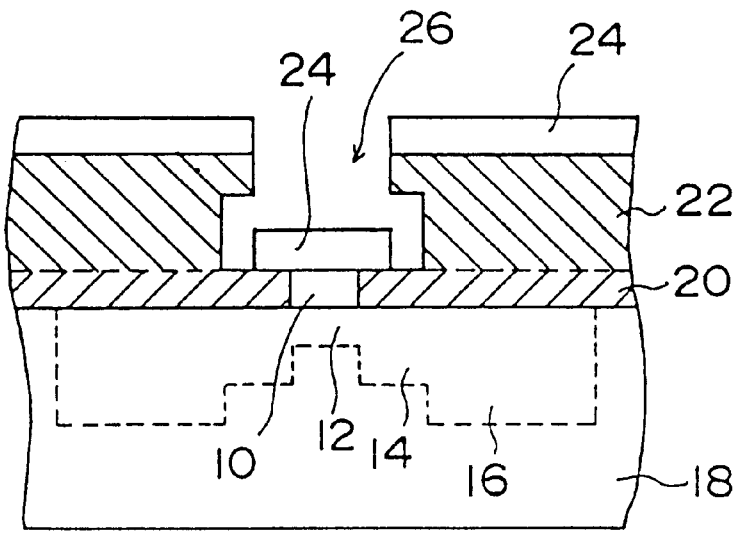
Figure 1E:
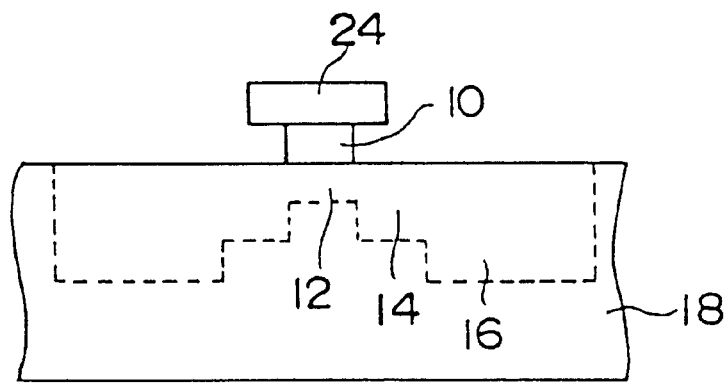
Figure 1F:
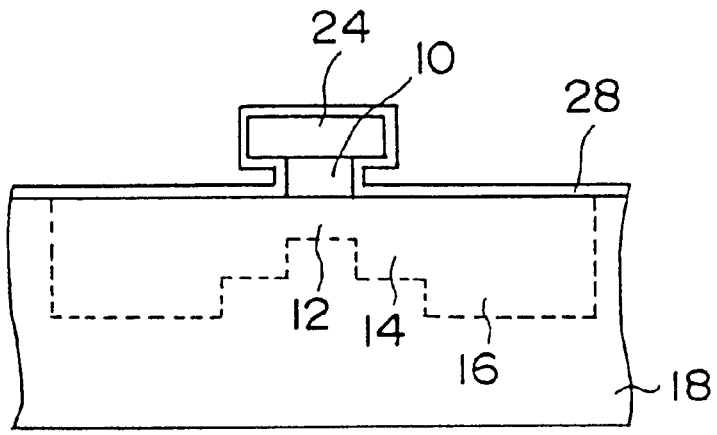
Figure 1G:
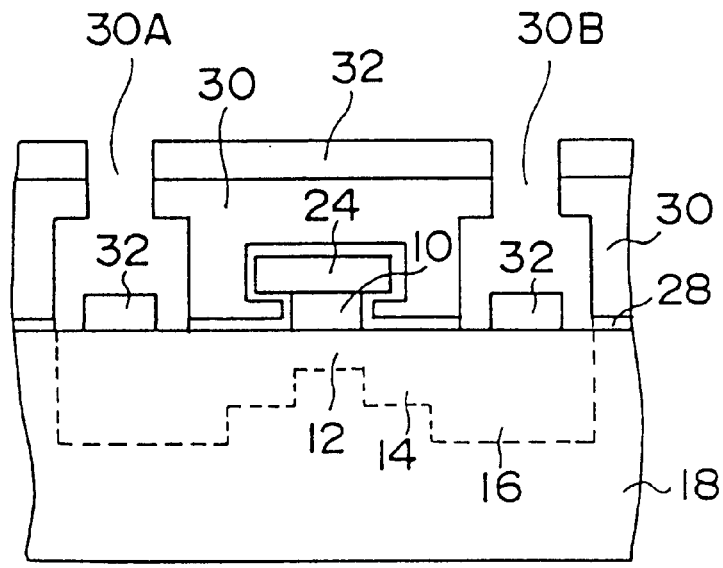
Figure 1H:
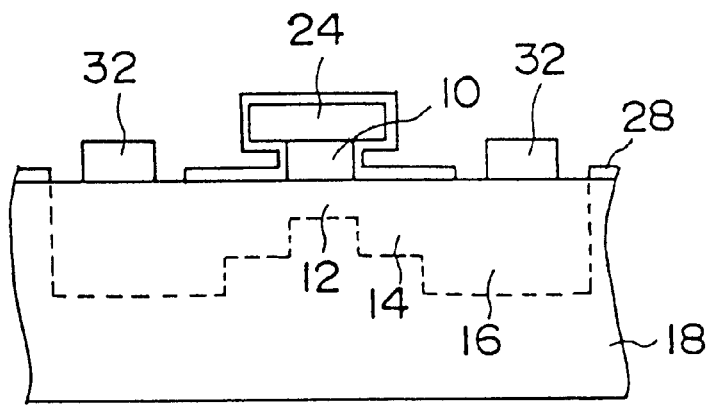
Figure 1I:
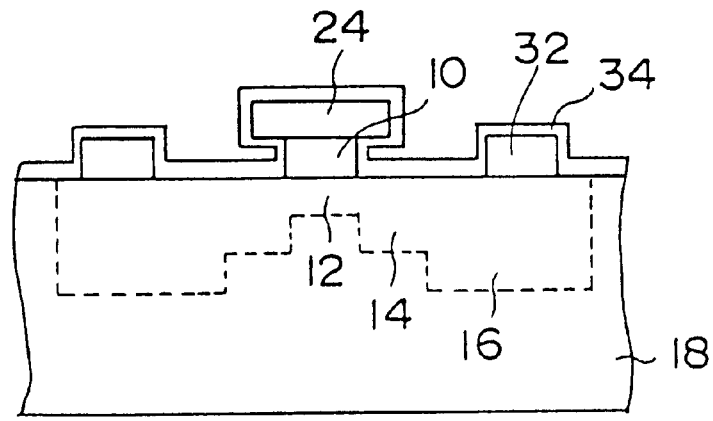
Figure 2A:
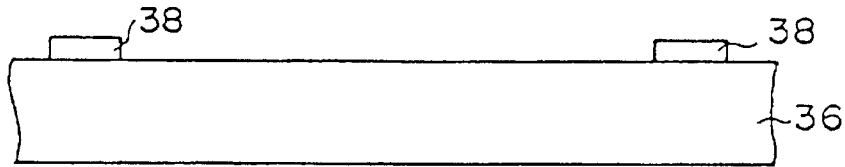
FIGS. 2A–2I are diagrams showing the fabrication process-of a conventional air bridge structure.
Figure 2B:
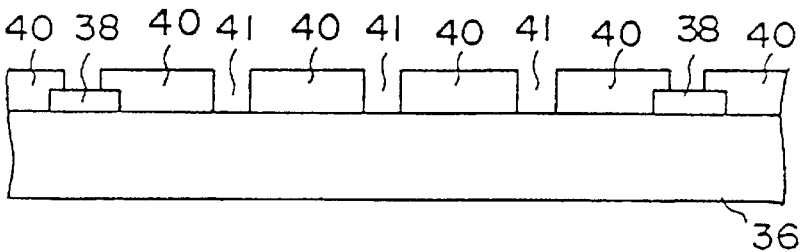
Figure 2C:
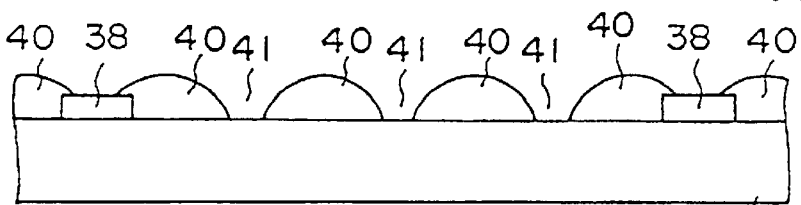
Figure 2D:
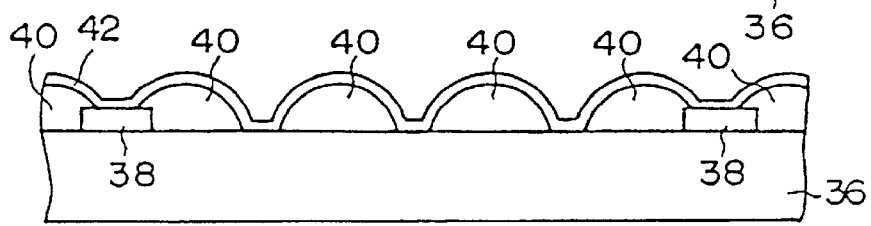
Figure 2E:
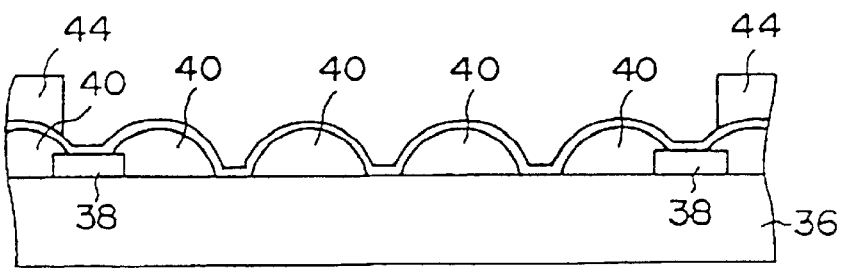
Figure 2F:
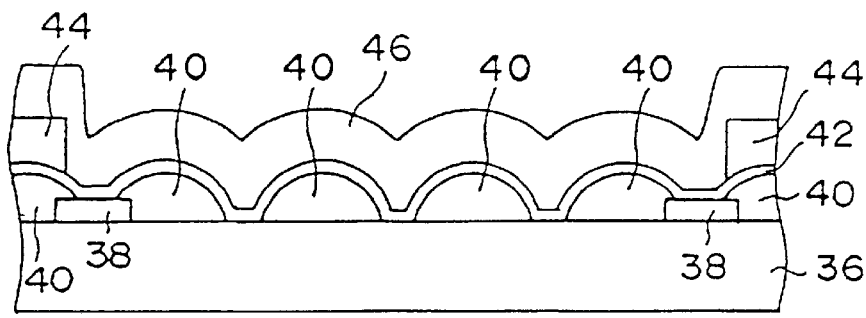
Figure 2G:
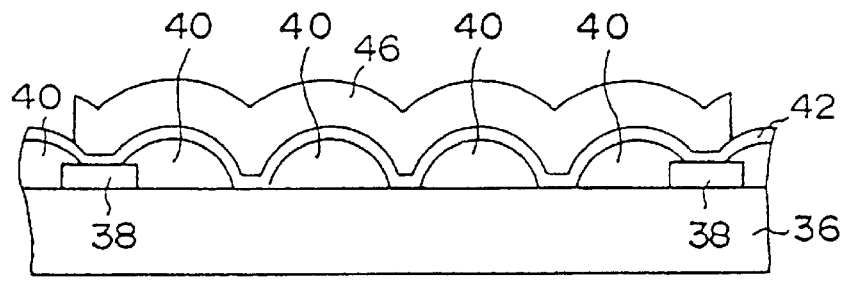
Figure 2H:
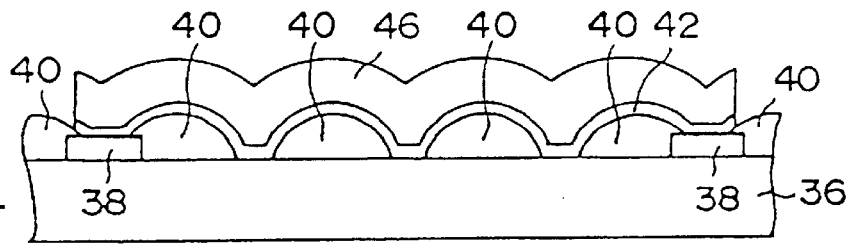
Figure 2I:
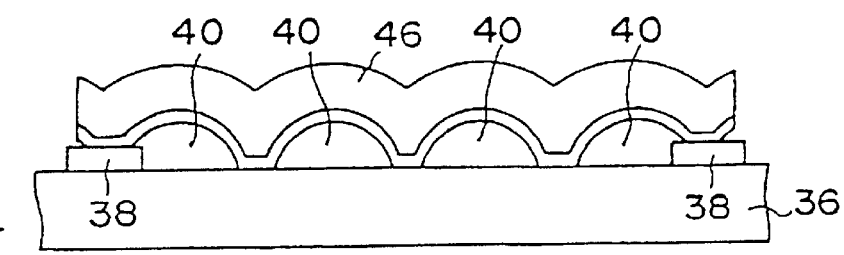
Figure 3A:
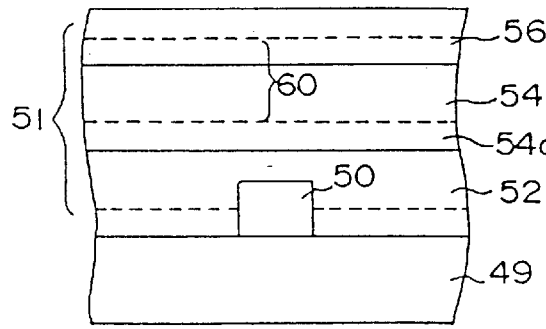
FIGS. 3A–3G are diagrams showing the principle of the present invention.

Referring to FIG. 3A, a lower gate electrode 50 is formed on a substrate 49 by a deposition and patterning process of a conductor layer, followed by a consecutive deposition process of first through third photoresist layers 52, 54 and 56 on the substrate 49, wherein the photoresist layer 52 is deposited so as to bury the gate electrode 50. The photoresist layers 52, 54 and 56 form thereby a resist structure 51. It should be noted that the first layer 52 is a low-sensitivity layer characterized by a slow dissolving speed when developed, while the second layer 54 is a high-sensitivity layer characterized by a large dissolving speed at the time of the development process. Further, the third layer 56 is a low-sensitivity layer similar to the photoresist layer 52.

Figure 3B:
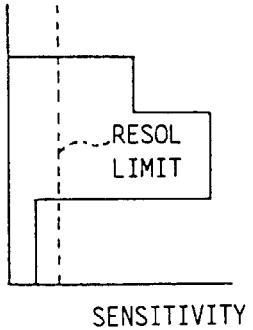

FIG. 3B shows the distribution of the sensitivity in the resist structure 51. The relationship of FIG. 3B may be regarded also as representing the distribution of the dissolving speed in the resist structure 51 at the time of the development process. Referring to FIG. 3B showing a hypothetical case in which no mixing of the resist occurs at the boundary of the resist layers, it can be seen that the resist sensitivity changes sharply at the boundaries.

Figure 3C:
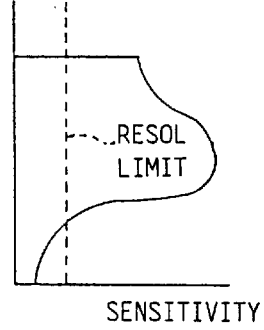

In the actual case, some mixing of the resist is inevitable at the boundary of the resist layers, particularly in relation to the heat treatment process for vaporizing the solvent, and there appears a transient region 54a in correspondence to the boundary between the first resist layer 52 and the second resist layer 54 and a transient region 60 in correspondence to the boundary between the second resist layer 54 and the third resist layer 56. As a result of the appearance of the transient region 54a or 60, the sensitivity distribution in the resist structure 51 becomes smooth as represented in FIG. 3C.

Figure 3D:
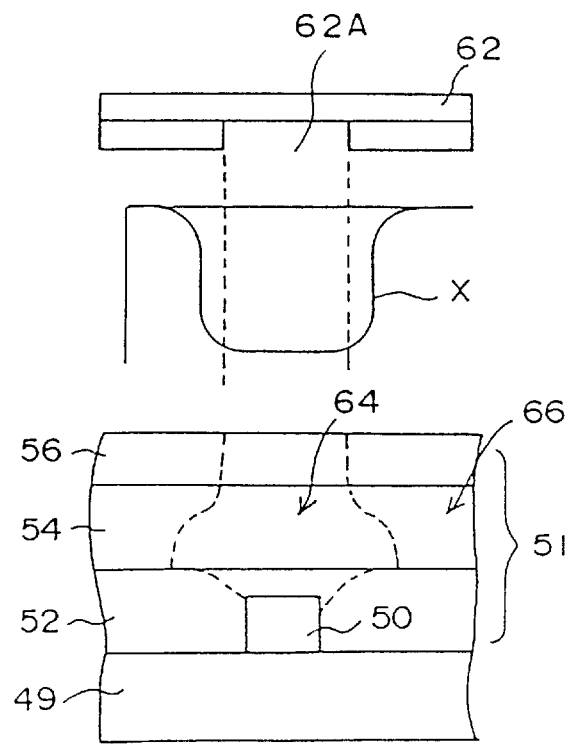

Next, in the step of FIG. 3D, an exposure is conducted on the resist structure 51 while using an exposure mask 62 having a mask window 62A. In such an exposure process, it should be noted that the second resist layer 54 having a high sensitivity experiences a photochemical reaction associated with the exposure, even in the part outside the mask window 62A due to the diffraction of the exposure optical beam represented in FIG. 3D by "X." As represented in FIG. 3D, the optical beam patterned by the mask 62 has an intensity outside the mask window 62A as a result of the diffraction of the optical beam at the edge of the mask window 62A.

On the other hand, the diffraction component X of the exposure optical beam is not sufficient to cause an exposure in the first or third photoresist layer 52 or 56 of low sensitivity. Thus, as a result of the optical exposure process conducted by using the photomask 62 on the resist structure having the sensitivity distribution profile shown in FIG. 3C, there is formed an exposure region 64 as represented in FIG. 3D, wherein it should be noted that the exposure region 64 has an increased width in correspondence to the high-sensitivity resist layer 54. Because of the existence of the transition region 60 at the boundary between the photoresist layer 54 and the photoresist layer 56, the exposure region 64 has a shape such that the lateral size thereof decreases gradually from the photoresist layer 54 to the photoresist layer 56. On the other hand, the transition region 54a formed between the photoresist layer 52 and the photoresist layer 54 has a reduced thickness, and thus, the lateral size of the exposure region 64 changes sharply from the photoresist layer 54 to the photoresist layer 52. The photoresist structure 51 outside the exposure region 64 forms an unexposed region 66.

Figure 3E:
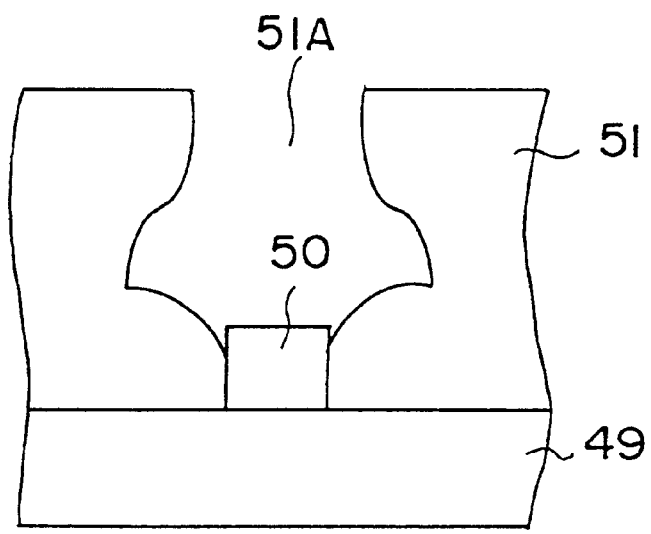

FIG. 3E shows the photoresist structure 51 of FIG. 3D after a developing process in which the exposed region 64 is removed as a result of the developing process. Because of the large dissolving speed of the high-sensitivity first photoresist layer 54, it will be noted that there is formed a resist opening 51A such that the resist opening 51A has an increased lateral size in correspondence to the first photoresist layer 54 as compared with the part corresponding to the first photoresist layer 52 or the third photoresist layer 56. In other words, the resist opening 51A has a inversely tapered cross-sectional structure.

In the developing process of the resist structure 51, it should be noted that the photoresist layer 52 of the low-sensitivity experiences the exposure only in the part adjacent to the top surface of the gate electrode 50. The exposure does not proceed in the photoresist layer 52 to the region adjacent to the substrate surface. Further, because of the small dissolving speed of the photoresist layer 52 in the development process, the surface of the substrate 49 is not exposed. The developing process stops more or less spontaneously when the top part of the gate electrode 50 is exposed, wherein the degree of exposure of the gate electrode 50 is controlled by optimizing the sensitivity, thickness or mixing of the first photoresist layer 52.

Figure 3F:
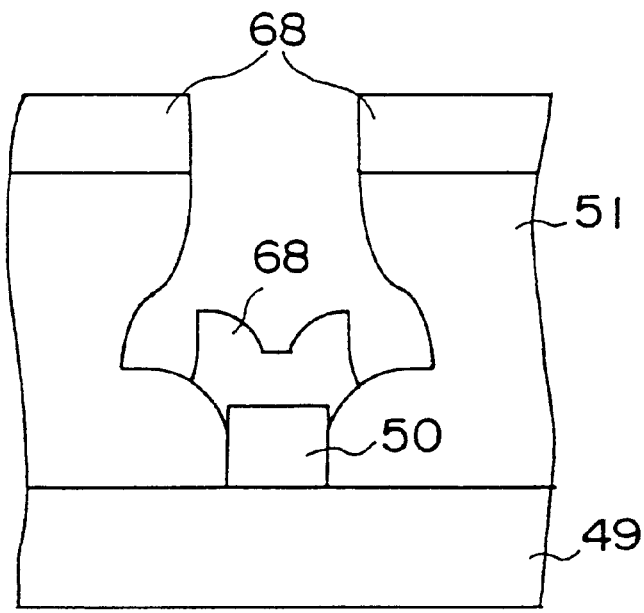
Figure 3G:
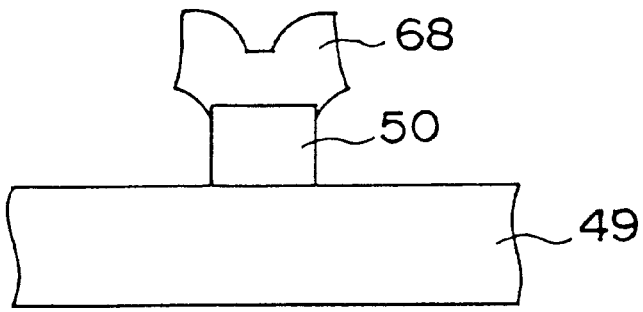

Next, in the step of FIG. 3F, a low-resistance metal layer 68 is deposited on the photoresist structure 51 of FIG. 3E by a vacuum evaporation process so as to include the resist opening 51A, and the part of the metal layer 68 on the resist structure 51 is lifted off in the step of FIG. 3G together with the resist structure 51 including the photoresist layers 52, 54 and 56.

It should be noted that the gate structure of FIG. 3G includes, in addition to the gate electrode 50 on the substrate 49, a low-resistance electrode layer formed on the gate electrode 50, wherein the low-resistance electrode layer is formed of a part of the low-resistance metal layer remaining on the gate electrode 50. The low-resistance electrode layer thus formed is designated by the reference numeral 68, wherein it should be noted that the low-resistance electrode layer 68 extends laterally on the gate electrode 50 and forms an overhang structure.

Because of the fact that the resist opening 51A has a lateral size that increases gradually in the first photoresist layer 52 toward the boundary between the photoresist layer 52 and the second photoresist layer 54 thereon (see FIG. 3D), the overhang part 68 increases the lateral size thereof gradually in the upward direction and the overhang part 68 forms, together with the underlying gate electrode 50, a generally Y-shaped gate electrode structure. It should be noted that such a Y-shaped gate electrode structure, in which the distance between the low-resistance electrode layer 68 and the substrate surface is increased as compared with the case of conventional T-shaped gate electrode structure, is advantageous for minimizing the stray capacitance. Further, because of the increased space between the overhang part of the low-resistance electrode layer 68 and the substrate surface, the supply of gaseous source material to the underside surface of the overhang structure is facilitated when depositing a passivation film on the structure of FIG. 3G by a vapor phase deposition process such as a CVD process. Thereby, the problem of thinning of the passivation film at the bottom part of the overhang structure 68 is effectively avoided.

In addition, the present invention, which relies on the use of the three-layer resist structure 51, provides a further advantageous feature of improved degree of planarization of the resist structure as a result of the mixing of the photoresist layers in the foregoing transition regions 54a and 60. Thereby, the first photoresist layer 52 has a generally uniform thickness irrespective of the area of the gate electrode 50. This means that the low-resistance electrode layer 68 is formed as designed or as desired, irrespective of the size or area of the gate electrode 50.

Further, because of the improved degree of planarization of the photoresist layers 52–56 constituting the photoresist structure 51, it becomes possible to form the dual-layer gate structure similar to that shown in FIG. 3G even after deposition of a passivation film provided so as to cover the gate electrode 50. It should be noted that the deposition of such a passivation film tends to enhance the variation in the height of the underlying electrode pattern 50. Of course, it is possible to deposit a passivation film after the dual-layer gate structure of FIG. 3G is formed as practiced conventionally.

It should be noted that the gate electrode 50 of FIG. 3G can be used also as a pillar supporting an air bridge structure. In such a case, the low-resistance electrode 68 extends laterally with a separation from the surface of the substrate 49 to form a conductor strip characteristic to an air bridge structure. In the air bridge structure having such a construction, the thermal curing process for the first photoresist layer can be omitted. Thereby, the problem of winkling of resist associated with the curing process is eliminated. Further, the problem associated with the difficulty of removing the photoresist pattern is also eliminated. Because of the fact that the thermal curing process of the resist is eliminated, the conductor strip of the air bridge structure extends generally in the plane parallel to the principal surface of the substrate 49.

As the exposure of the photoresist structure 51 is conducted in a single exposure step in the present invention in any of the case of forming a Y-shaped gate electrode or an air bridge structure, the present invention contributes to the decrease of the number of fabrication steps.

[FIRST EMBODIMENT]

FIGS. 4A–4D show the fabrication process of a MESFET according to a first embodiment of the present invention.

Figure 4A:
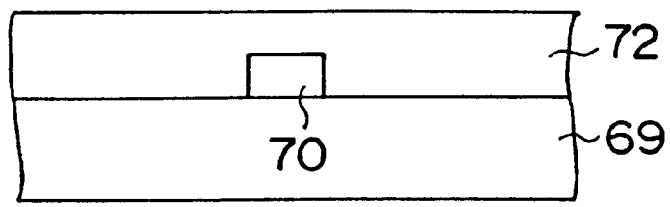
FIGS. 4A–4D are diagrams showing the fabrication process of a semiconductor device according to a first embodiment of the present invention.

Referring to FIG. 4A, a lower electrode 70 is patterned on a substrate 69 and a first photoresist layer 72 is deposited on the substrate 69 so as to cover the lower electrode 70. After a vaporizing process for evaporating the solvent in the resist layer 72, a thermal annealing process is conducted on the first photoresist layer 72 so as to reduce the dissolving speed at the time of the developing process. In the present embodiment, the photoresist layer 72 is heat-treated at about 150° C. for about 10 minutes.

Figure 4B:
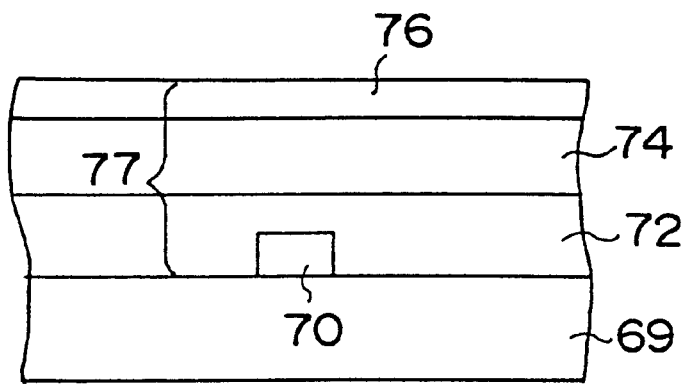

Next, in the step of FIG. 4B, a second photoresist layer 74 and a third photoresist layer 76 are deposited consecutively on the first photoresist layer 72 thus heat-treated, by a spin-coating process. After the deposition of the photoresist layers 74 and 76, a thermal annealing process is conducted at an ordinary condition of 85° C. for 90 seconds. Thereby, a photoresist structure 77 including the photoresist layers 72, 74 and 76 is obtained.

Figure 4C:
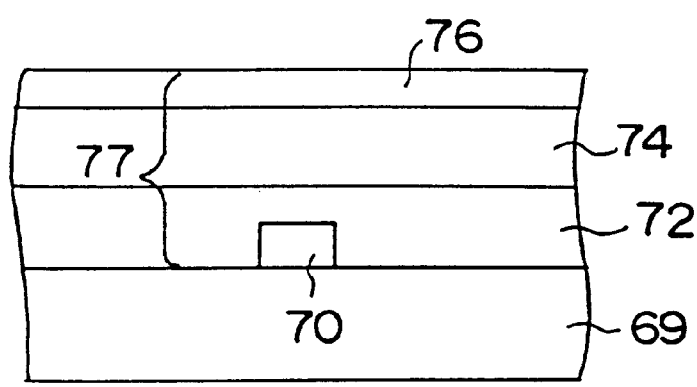
Figure 4D:
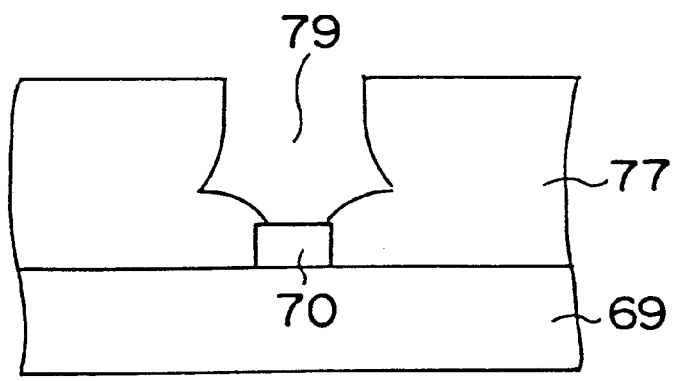

Next, in the step of FIG. 4C, the photoresist structure 77 thus formed is subjected to an exposure process while using a mask 78 having a predetermined mask window, and the exposed part of the photoresist structure 77 is dissolved by a developing process in the step of FIG. 4D to form a resist opening 79, wherein the developing process is conducted so as to expose the top surface of the gate electrode 70 at the bottom part of the resist opening 79.

Hereinafter, the mechanism of the developing process of the resist structure 77 will be described.

In the present embodiment, a cresol novolak resin is used for the photoresist layers 72, 74 and 76 in combination with a photosensitive agent of naphtoquinone azide (NQD), wherein the photoresist layers 72, 74 and 76 having such a composition function as a positive photoresist. While the cresol novolak resin itself is soluble to alkaline developing solution, the photoresist thus containing NQD is prevented from being dissolved by such an alkaline developing solution (such as TMAH; tetramethylammonium hydride) as a result of the hydrophobic nature of NQD contained in the resist. When the photoresist is exposed, the NQD molecules in the photoresist produces indeneketene molecules, and the indeneketene molecules thus released react with water in the photoresist to form an indenecarbonic acid, which is soluble to the alkaline developing solution.

In the present invention, it is important that the photoresist layers 72, 74 and 76 constituting the photoresist structure 77, particularly the photoresist layer 72, have respective dissolving speeds against the alkaline developing solution, wherein it should be noted that there are several ways to reduce the dissolving speed of the photoresist layer 72. For example, the water in the photoresist layer 72 may be removed. In such a case, the change of the NQD molecules to become soluble to the alkaline developing solution is suppressed because of the lack of water in the photoresist layer. Alternatively, the molecular weight of the novolak resin forming the photoresist layer 72 may be increased by facilitating the polymerization (bridging) reaction. Further, it is also possible to destroy the NQD molecules chemically. In the example of FIG. 4A, the photoresist layer 72 is subjected to the thermal annealing process at 150° C. as noted before.

Further, it is also possible to change the optimum exposure wavelength for the photoresist layer 72 with respect to the photoresist layer 74 or 76. For example, there are novolak resin compositions for the exposure to the g-line radiation (436 nm) of Hg and to the i-line radiation (365 nm) of Hg. By combining such different novolak resin compositions in the photoresist structure 77, it is possible to induce a sensitivity profile in the photoresist structure 77 such as the one explained with reference to FIG. 3D. By applying a thermal annealing process to the photoresist layer 72 included in such a photoresist structure 77 at the temperature of 150° C. as noted before, it becomes possible to enhance the difference in the dissolving speed of the photoresist layer at the time of the developing process.

Further, it is also possible to suppress the exposure of the photoresist layer 72 by admixing a dye to the photoresist layer 74. By doing so, the optical beam used for the exposure of the photoresist structure 77 is absorbed by the dye molecules in the photoresist layer 74, and the exposure dose in the underlying photoresist layer 72 is reduced.

By using the foregoing three-layer construction for the photoresist structure 77, it becomes possible to suppress the dissolving speed of the lowermost photoresist layer 72 at the time of the developing process, and the resist opening 79 does not reach the surface of the substrate 69. In other words, the process margin for forming the resist opening 79 by the exposure and development process is substantially increased. In other words, the present embodiment enables formation of the Y-shaped gate structure shown in FIG. 3G with reproducibility.

[SECOND EMBODIMENT]

FIGS. 5A–5F show the fabrication process of a MESFET according to a second embodiment of the present invention.

Figure 5A:
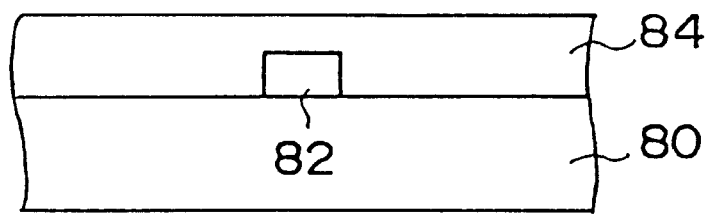
FIGS. 5A–5F are diagrams showing the fabrication process of a semiconductor device according to a second embodiment of the present invention.

Referring to FIG. 5A, a lower electrode 82 is formed on a substrate 80 by a patterning process of a conductor layer covering the substrate 80, and a first photoresist layer 84 is applied on the substrate 80 by a spin-coating process such that the photoresist layer 80 covers the lower electrode 82.

Further, the lower electrode 82 is subjected to a thermal annealing process conducted typically at 150° C. for 10 minutes, wherein it should be noted that the temperature of the thermal annealing process is set higher than the temperature used usually for evaporating the solvent.

Figure 5B:
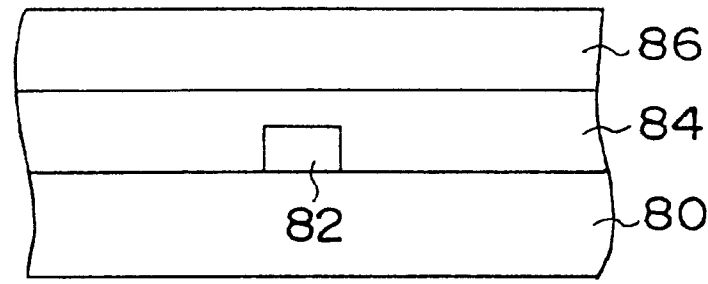

Next, in the step of FIG. 5B, a second photoresist layer 86 is formed on the first photoresist layer 84 by a spin-coating process, and a thermal annealing process is conducted at the temperature of 85° C. for 90 seconds for evaporating the solvent form the photoresist layer 86.

Figure 5C:
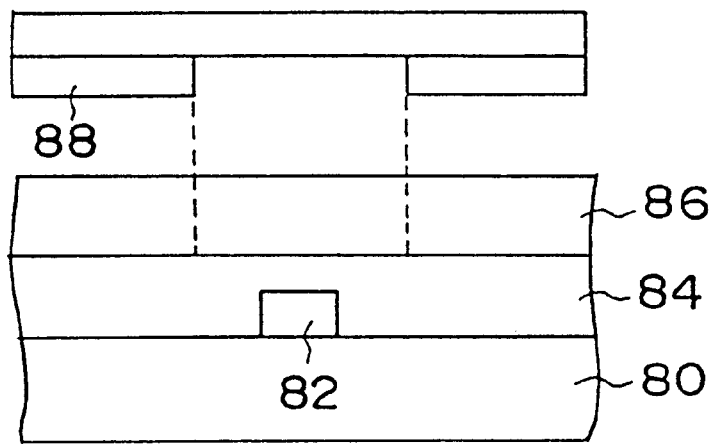

Next, in the step of FIG. 5C, the second photoresist layer 86 is subjected to an optical exposure process while using a first photomask 88, which is similar to the photomask 78 used in the previous embodiment.

Figure 5D:
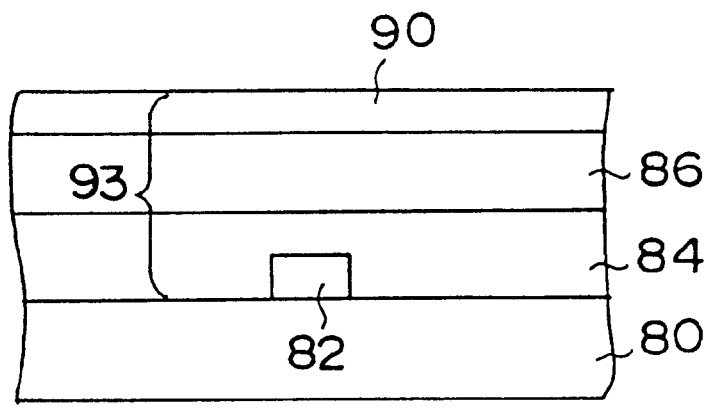

Next, in the step of FIG. 5D, a polyvinyl alcohol (PVA) is applied to the surface of the photoresist layer 86 as a mixing suppressor, and a thermal annealing process is applied to the photoresist layer 86. The thermal annealing process is typically conducted at 120° C. for 90 seconds. Further, a third photoresist layer 90 is deposited on the second photoresist layer 86 thus processed, followed by a thermal annealing process conducted under a condition identical with the condition of the thermal annealing process applied to the second photoresist layer 86.

Figure 5E:
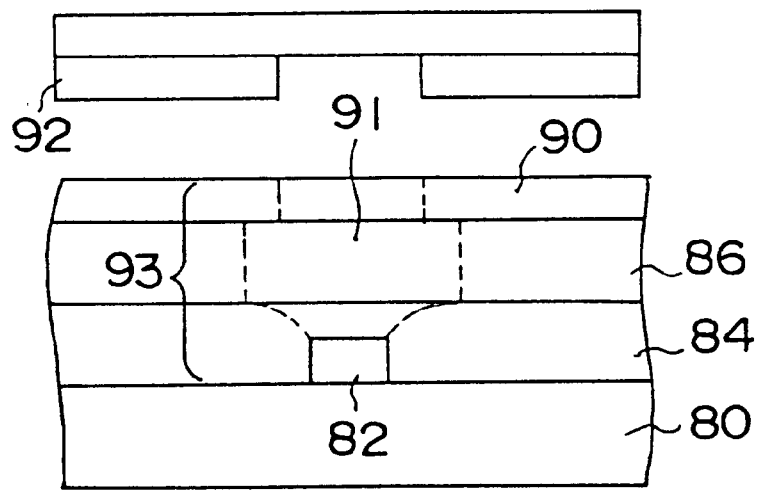

In the present embodiment, the mixing of resist at the boundary between the photoresist layer 86 and the photoresist layer 90 is suppressed by applying a PVA coating, and the Next, in the step of FIG. 5E, an exposure process is conducted while using a second photomask 92, wherein it should be noted that the second photomask 92 has a mask window smaller in size than the mask window of the first photomask 88, such that the exposure region exposed in the third photoresist layer 90 has a lateral size smaller than the lateral size of the exposure region formed in the photoresist layer 86 by the photomask 88. As a result of the foregoing exposure process in the step of FIG. 5C and FIG. 5E, an exposure region 91 is formed in the photoresist structure as represented in FIG. 5E.

Figure 5F:
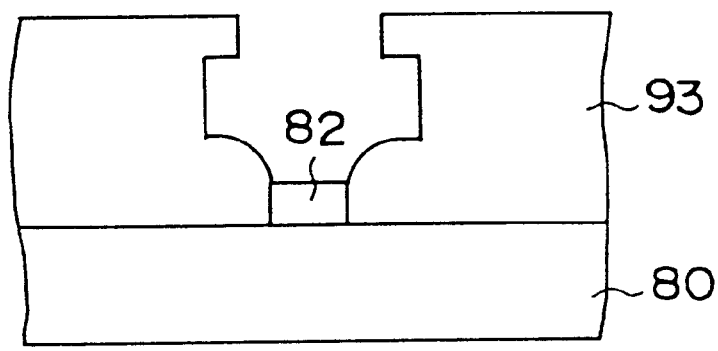

Further, in the step of FIG. 5F, the foregoing exposure region 91 is developed until the top part of the lower electrode 82 is exposed. By depositing a low-resistance metal layer on the photoresist structure 93 and conducting a subsequent lift-off process, a Y-shaped gate structure similar to that shown in FIG. 3G is obtained.

In the present embodiment, all the photoresist layers 84, 86 and 90 are formed of a resist composition having a sensitivity to the i-line radiation of Hg. Contrary to the previous embodiment, which uses the extensive mixing of the resist at the boundary between the photoresist layers 54 and 56, the present embodiment forms the structure suitable for lift-off, by conducting the exposure process twice, first by using the photomask 88 having a small mask window and next by using the photomask 90 having a larger mask window. Further, the present embodiment can control the lateral size of the exposure region 91 by controlling the lateral size of the mask window of the photomask 88 or photomask 90. It should be noted that PVA is used extensively in the art to prevent the mixing of resist at resist boundaries. A PVA thus applied forms a thin layer soluble to alkaline developing solution in the photoresist layer.

[THIRD EMBODIMENT]

FIGS. 6A–6I show the fabrication process of a MESFET according to a third embodiment of the present invention.

Figure 6A:
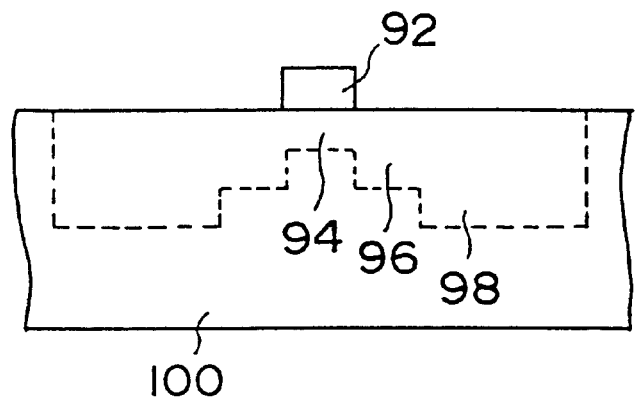
FIGS. 6A–6I are diagrams showing the fabrication process of a semiconductor device according to a third embodiment of the present invention.

Referring to FIG. 6A, a channel region 94 is formed in the surface part of a semi-insulating GaAs substrate 100 by an ion implantation of $Si^+$, followed by a patterning process of a WSi layer formed on the substrate 100 to form a gate electrode 92 in correspondence to the channel region 94.

Next, an ion implantation process of $Si^+$ is conducted into the substrate 100 while using the gate electrode 92 as a mask, to form a diffusion region 96 of the $n^-$-type in the substrate 100 at both lateral sides of the gate electrode 92. Further, a side wall oxide film is formed at both lateral sides of the gate electrode 92, and an ion implantation process of $Si^+$ is conducted again while using the gate electrode 92 and the side wall oxide film as a mask, to form a diffusion region 98 of the $n^+$-type at the outer side of the diffusion region 96. The diffusion regions thus formed are activated by a thermal annealing process, and there is formed an LDD structure in the substrate 100 underneath the gate electrode 92.

Figure 6B:
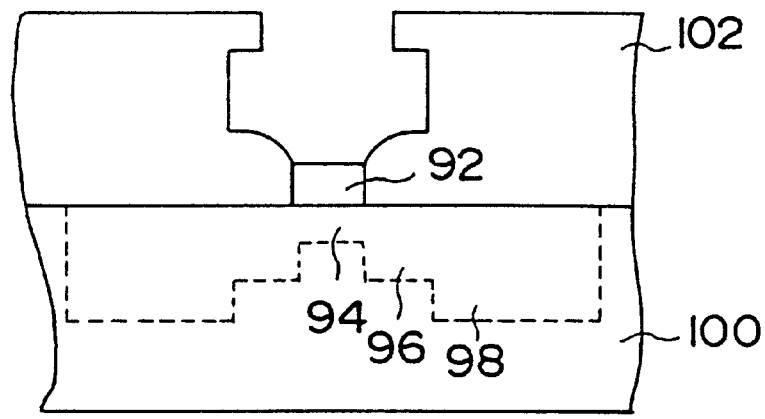

Next, in the step of FIG. 6B, a photoresist pattern 102 is formed on the substrate 100, followed by an exposure process conducted similarly to the second embodiment, to form a resist opening exposing the top surface of the gate electrode 92.

Figure 6C:
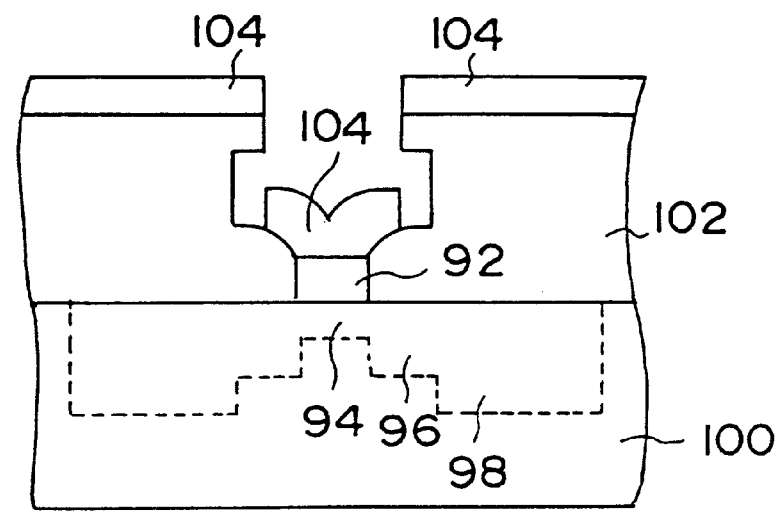

Next, in the step of FIG. 6C, a layer 104 of a low-resistance metal such as Au is deposited on the structure of FIG. 6B by a vacuum evaporation process, such that the layer 104 is formed not only on the resist pattern 102 but also on the WSi gate electrode 92 exposed in the resist opening. In order to improve the adherence between the WSi gate electrode 92 and the Au layer 104 thereon, there is interposed a thin Ti layer not shown between the gate electrode 92 and the Au layer 104. It should be noted that the gate electrode 92 has a height of about 400 nm, while the Au layer 104 has a thickness of about 200 nm. The Ti layer may have a thickness of about 5 nm.

Figure 6D:
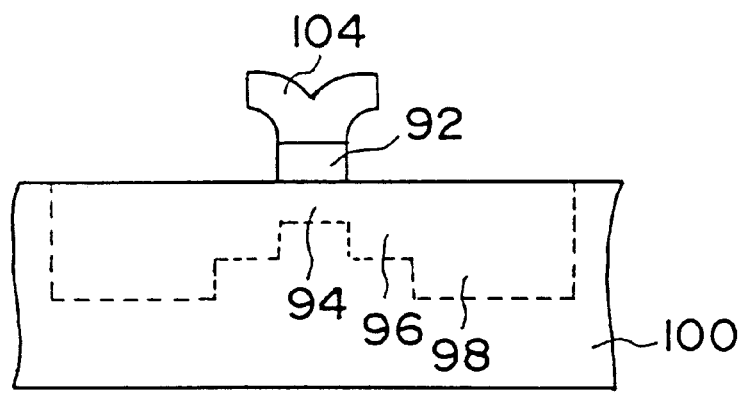

Next, in the step of FIG. 6D, the resist pattern 102 is lifted off together with the Au layer 104 thereon, leaving behind a Y-shaped, dual-layer gate structure on the substrate 100.

Figure 6E:
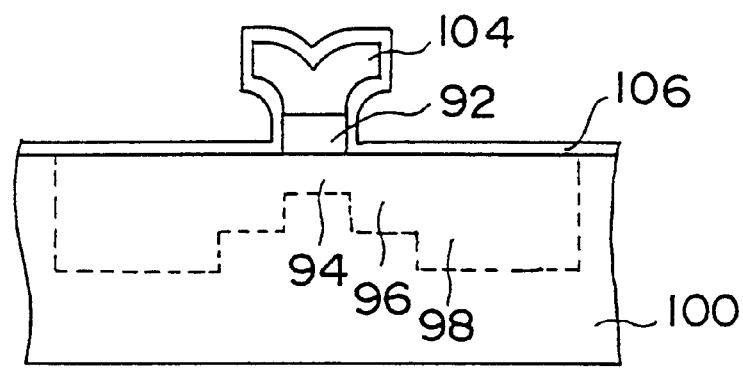
Figure 6F:
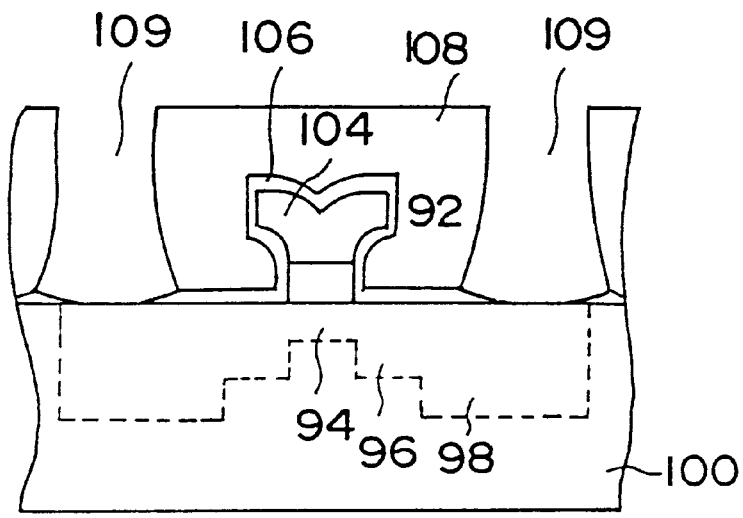

Next, in the step of FIG. 6E, a passivation film 106 of SiN is deposited on the structure of FIG. 6D by a plasma CVD process with a thickness of 0.1 $\mu$m so as to cover the top surface of the substrate 100 and further the side surface and the top surface of the Y-shaped gate structure, and a step of FIG. 6F is conducted subsequently in which a photoresist layer 108 is deposited on the structure of FIG. 6E so as to bury the Y-shaped gate electrode covered with the passivation film 106. The photoresist layer 108 is patterned subsequently to form a resist opening 109 such that the resist opening 109 exposes a part of the passivation film 106 covering the diffusion region 98 of the $n^+$-type. The passivation film 106 thus exposed by the resist opening 109 is then patterned by a dry etching process while using the photoresist layer 108 by a dry etching process.

Figure 6G:
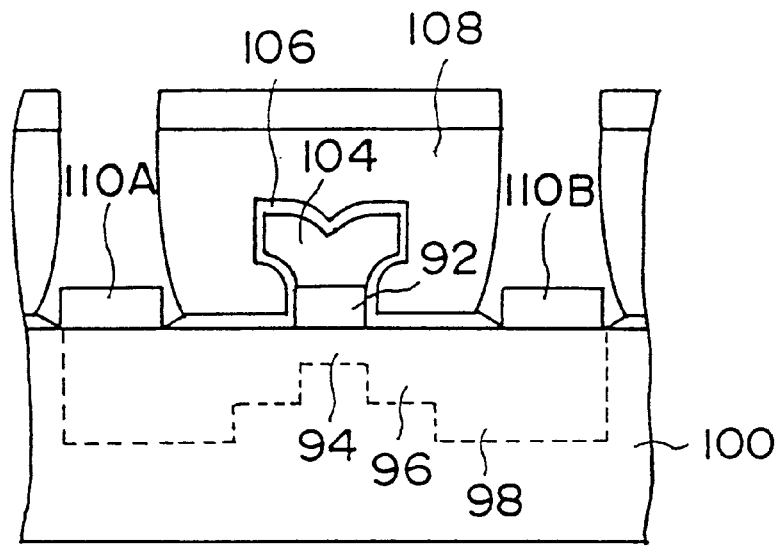

Next, in the step of FIG. 6G, a metal layer 110 making an ohmic contact with the substrate 100 is deposited on the photoresist layer 108 including the exposed part of the substrate 100 by a vacuum evaporation process such that ohmic electrodes 110A and 110B are formed in correspondence to the exposed part of th substrate 100. After the step of FIG. 6G, the photoresist layer 108 is lifted off together with the metal layer 110 thereon in the step of FIG. 6H, and the ohmic electrodes 110A and 110B make an ohmic contact with the $n^+$-type diffusion regions 98 after a thermal annealing process.

Figure 6H:
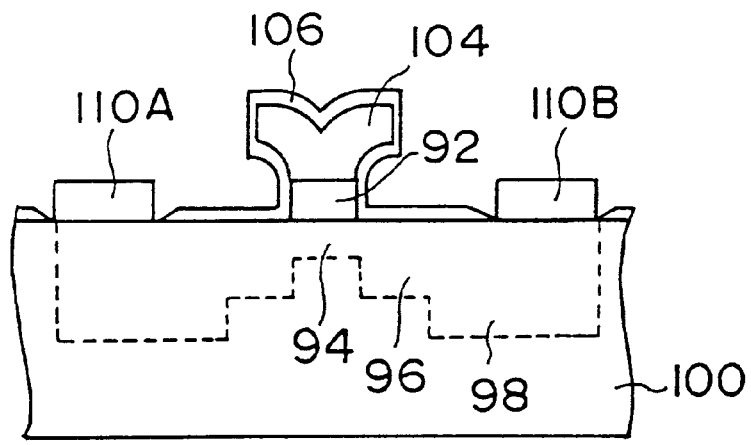
Figure 6I:
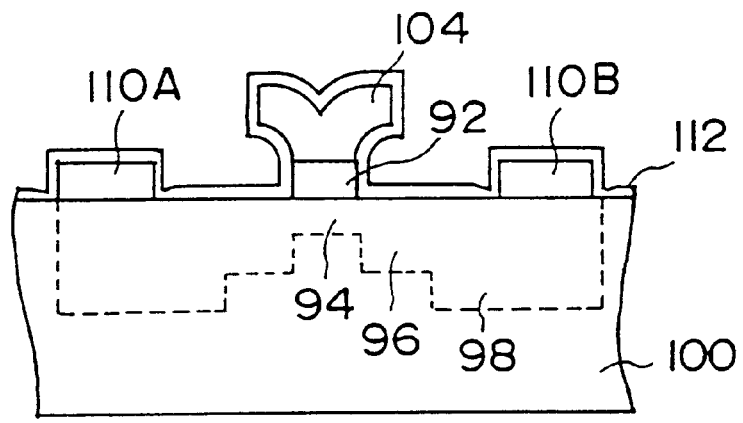

Next, in the step of FIG. 6I, the structure of FIG. 6H is covered by a passivation film 112 of SiN having a thickness of about 20 nm, wherein the passivation film 112 is deposited by a plasma CVD process and covers not only the exposed surface of the substrate 100 and the Y-shaped dual-layer gate structure but also the surface of the ohmic electrodes 110A and 110B.

According to the process of the present embodiment, the dual gate structure formed in the step of FIG. 6C has the desired Y-shaped form due to the mixing of the resist occurring at the boundary between the first resist layer corresponding to the photoresist layer 72 and the second layer corresponding to the second resist layer 74 of FIG. 4B, Thereby, the stray capacitance of the gate electrode is successfully minimized while simultaneously minimizing the gate resistance by the low-resistance layer 104. As the space between the low-resistance layer 104 forming the Y-shaped overhang structure and the surface of the substrate 100 is thus increased in the structure of FIG. 6I, the transport of gaseous source into such a space is facilitated substantially in the plasma CVD process used for forming the passivation film 112. Thereby, the passivation film 112 has a generally uniform thickness irrespective of whether the passivation film 112 covers the top surface of the low-resistance layer 104 or the passivation film 112 covers the side wall of the gate electrode 92 or the bottom surface of the Y-shaped overhang structure 104. As the passivation film 112 has a uniform thickness as such, the problem of variation of the threshold voltage of the MESFET induced by the piezoelectricity of the GaAs substrate 100 is effectively eliminated.

[FOURTH EMBODIMENT]

FIGS. 7A–7I show the fabrication process of an FET according to a fourth embodiment of the present invention.

Figure 7A:
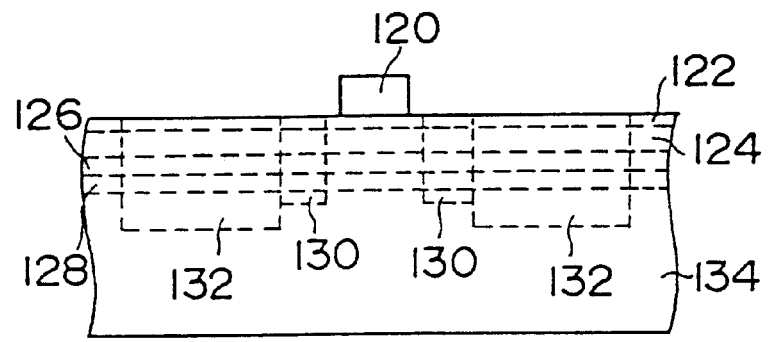
FIGS. 7A–7I are diagrams showing the fabrication process of a semiconductor device according to a fourth embodiment of the present invention.

Referring to FIG. 7A, a GaAs layer 128 of the n-type is formed epitaxially on a semi-insulating GaAs substrate 134, and an undoped InGaAs layer 126 is formed on the foregoing GaAs layer 128 with an epitaxial relationship. Further, an undoped AlGaAs layer 124 and an undoped GaAs layer 122 are deposited further thereon consecutively to form a semiconductor layered structure, wherein the deposition of the layers 122–128 may be conducted by an MOVPE (metal-organic vapor phase epitaxy) process or an MBE (molecular beam epitaxy) process.

After the formation of the layered semiconductor structure, a WSi gate electrode 120 is formed on the GaAs layer 122 by a patterning process of a WSi layer formed on the GaAs layer 122. Further, an ion implantation process of $Si^+$ is conducted into the semiconductor layered structure while using the WSi gate electrode 120 for form a diffusion region 130 of the $n^-$-type in the semiconductor layered structure at both lateral sides of the gate electrode 120.

Next, a side wall oxide film not illustrated is formed at both lateral sides of the gate electrode 120 and an ion implantation process of $Si^+$ is conducted again into the layered semiconductor structure while using the gate electrode 120 and the side wall oxide films thereon as a mask, to form a diffusion region 132 of the $n^+$-type at respective outer sides of the $n^-$-type diffusion regions 130. The atoms of the impurity element thus introduced into the diffusion regions 130 and 132 are activated by a thermal annealing process, and there is formed an LDD structure in the layered semiconductor structure on the substrate 134.

Figure 7B:
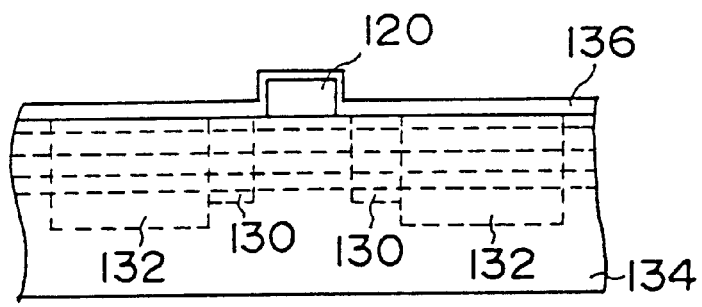

Next, in the step of FIG. 7B, a passivation film 136 of SiN is deposited on the surface of the structure of FIG. 7A by a plasma CVD process, such that the passivation film 136 protects the undoped GaAs layer 122 covering the AlGaAs layer 124, wherein it should be noted that the GaAs layer 122 is provided so as to avoid the oxidation of the AlGaAs layer 124. When the AlGaAs layer 124 is oxidized, the operational characteristics of the FET will be seriously deteriorate. Thus, it is important to protect the GaAs layer 122 from being damaged by providing the passivation film 136. Generally, the passivation film 136 has a thickness of about 0.1 μm.

Figure 7C:
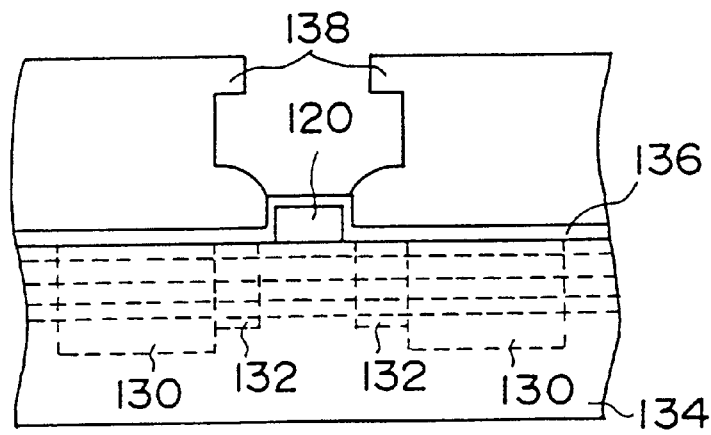

Next, in the step of FIG. 7C, a photoresist layer 138 is formed on the structure of FIG. 7B according to a process similar to the second embodiment, such that the passivation film 136 covering the top surface of the gate electrode 120 is exposed at the bottom part of the resist opening formed in the photoresist layer 138.

Figure 7D:
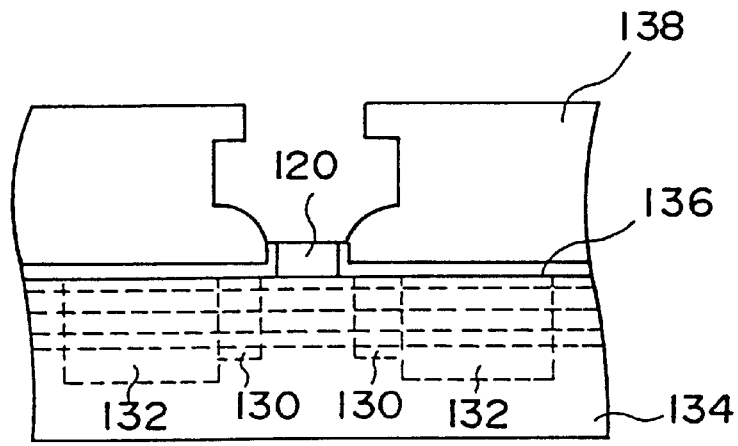
Figure 7E:
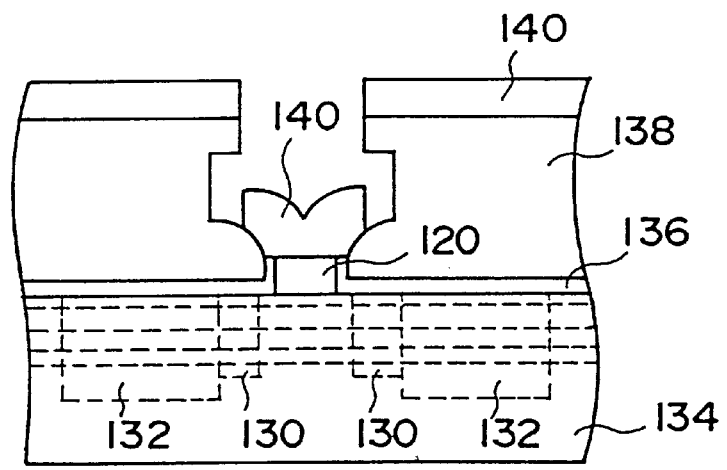

Next, in the step of FIG. 7D, the exposed passivation film 136 is removed by a dry etching process, and a low-resistance metal layer 140 is deposited on the structure of FIG. 7D including the exposed gate electrode 120 as represented in FIG. 7E by a vacuum evaporation process.

Figure 7F:
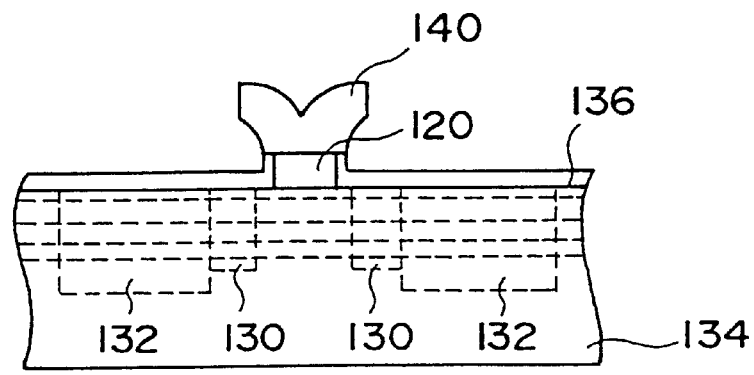

Further, the photoresist layer 138 is removed by a lift-off process in the step of FIG. 7F together with the metal layer 140 deposited thereon, and the Y-shaped, dual-layer gate structure is obtained on the substrate 134 in the state that the exposed surface of the substrate 134 and the side walls of the WSi gate electrode 120 are covered by the passivation film 136.

Next, the structure of FIG. 7F is covered by a photoresist layer 142, followed by a patterning process thereof to form resist openings in correspondence to the foregoing $n^+$-type diffusion regions 132, and a dry etching process is applied to the passivation film 136 exposed by the resist openings, such that the diffusion regions 132 are exposed in correspondence to the resist openings. Further, a metal layer 144 is deposited on the photoresist layer 142 including the resist openings such that ohmic electrodes 144A and 144B are formed in the foregoing resist openings in ohmic contact with the diffusion regions 132, and the photoresist layer 144 is lifted off in the step of FIG. 7H together with the metal layer 144 thereon. Further, a passivation film 146 is deposited on the structure of FIG. 7H in the step of FIG. 7I.

According to the present invention, the process of removing the passivation film 136 from the top surface of the gate electrode 120 in the step of FIG. 7D is effectively controlled by monitoring the change of the thickness of the photoresist layer 138. It should be noted that the resist structure 138 of FIG. 7C has an improved degree of planarization due to the mixing of the resist at the boundary between the lowermost photoresist layer and the intermediate photoresist layer. Thereby, the problem of the gate electrode 120 being etched excessively in the step of FIG. 7D for removing the passivation film 136 is effectively avoided.

Other advantageous features of the present embodiment are the same as in the case of the previous embodiments and further description thereof will be omitted.

[FIFTH EMBODIMENT]

FIGS. 8A–8H show the fabrication process of a MESFET according to a fifth embodiment of the present invention.

Figure 8A:
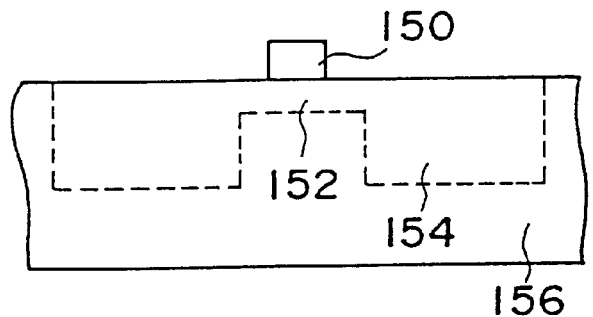
FIGS. 8A–8H are diagrams showing the fabrication process of a semiconductor device according to a fifth embodiment of the present invention.

Referring to FIG. 8A, a channel region 152 is formed in a surface part of a semi-insulating GaAs substrate 156 by an ion implantation process of $Si^+$, wherein the ion implantation process is conducted under an acceleration energy of about 80 keV, which is slightly larger than the acceleration energy used conventionally for such a purpose. Next, a WSi gate electrode 150 is formed on the GaAs substrate 156 in correspondence to the channel region 152 by a deposition and patterning process of a WSi layer, followed by an ion implantation process of $Si^+$ into the substrate 156 while using the gate electrode 150 as a self-alignment mask. Further, a thermal annealing process is conducted and a $n^+$-type diffusion region 154 is formed at both lateral sides of the gate electrode 150.

Figure 8B:
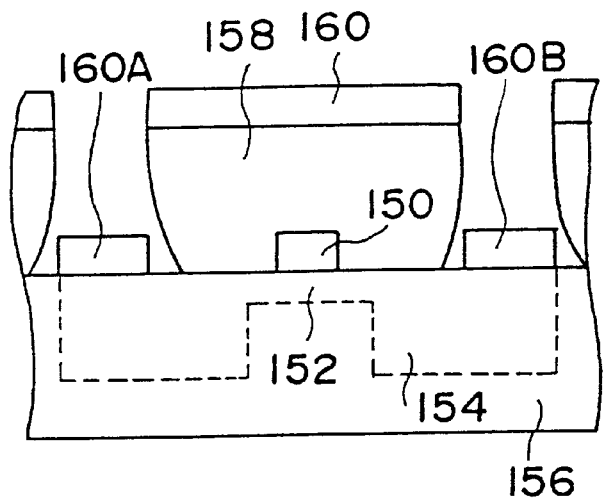

Next, in the step of FIG. 8B, a photoresist layer 158 is deposited on the structure of FIG. 8A so as to bury the gate electrode 150, followed by an exposure and developing process to form a resist opening in correspondence to each of the diffusion regions 154. Further, a metal layer 160 is deposited on the photoresist layer 158 by a vacuum evaporation process including the foregoing resist openings, to form ohmic electrodes 160A and 160B in each of the resist openings in ohmic contact with the exposed diffusion regions 154.

Figure 8C:
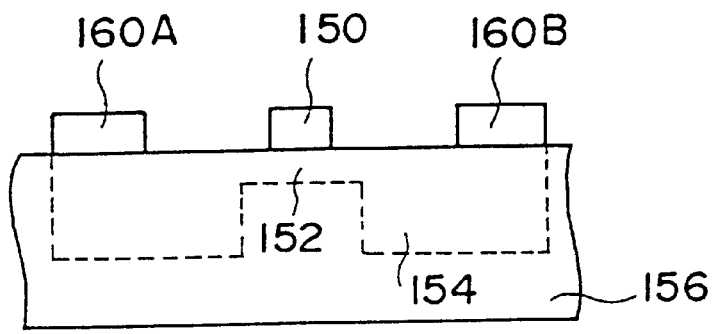

Next, in the step of FIG. 8C, the photoresist layer 158 is lifted off together with the metal layer 160 thereon to form a structure in which the ohmic electrodes 160A and 160B are formed on the substrate 156 at both lateral sides of the gate electrode 150.

Figure 8D:
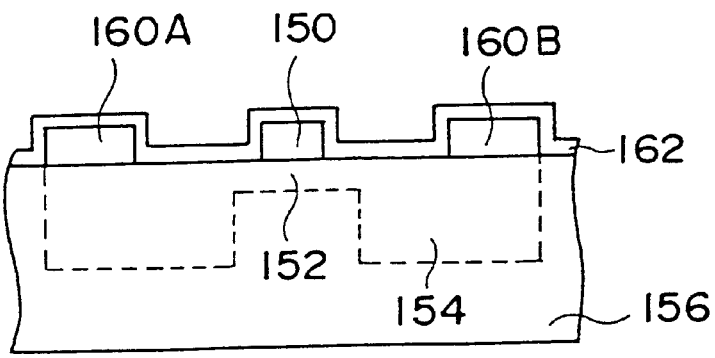

Next, in the step of FIG. 8D, a plasma CVD process is conducted to form a passivation film 162 such that the passivation film covers the exposed surface of the substrate 156 as well as the lateral and top surfaces of each of the gate electrode 150, the ohmic electrode 160A and the ohmic electrode 160B. Typically, the passivation film 162 is formed of SiN having a thickness of about 20 nm.

Figure 8E:
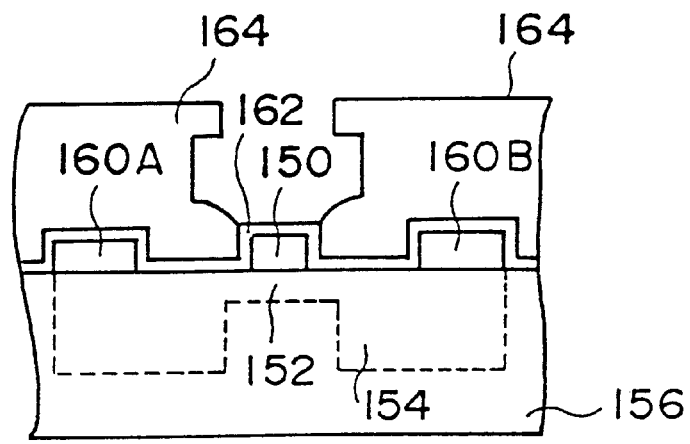

Next, in the step of FIG. 8E, a three-layer photoresist structure 164 similar to the three-layer photoresist structure described previously is deposited on the structure of FIG. 8D, followed by an exposure and developing process similar to the process of the second embodiment, to form a resist window in correspondence to the gate electrode 150, such that the passivation film 162 covering the gate electrode 150 is exposed.

Figure 8F:
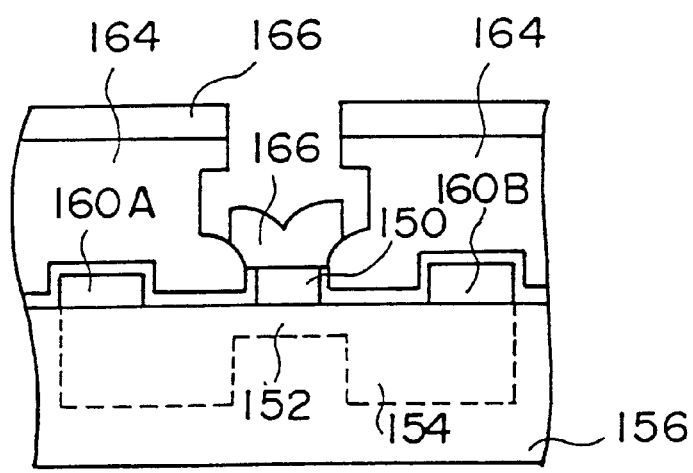

Next, in the step of FIG. 8F, the exposed part of the passivation film 162 is removed by a dry etching process and a low-resistance metal layer 166 is deposited on the photoresist structure 164 by a vacuum evaporation process including the foregoing resist opening. Thereby, the low-resistance metal layer 166 form a Y-shaped structure on the top part of the WSi gate electrode 150.

Figure 8G:
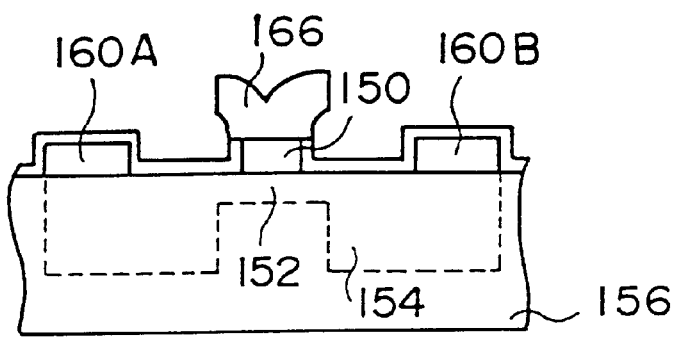
Figure 8H:
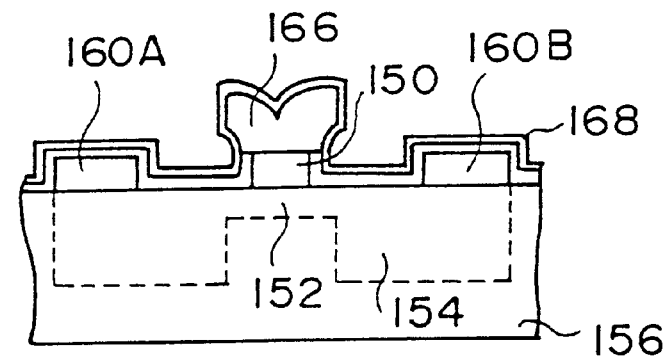

Next, the photoresist structure 164 is lifted off in the step of FIG. 8G together with the metal layer 166 thereon, and another passivation film 168 of SiN is deposited in the step of FIG. 8H on the structure of FIG. BG by a plasma CVD process.

Figure 7G:
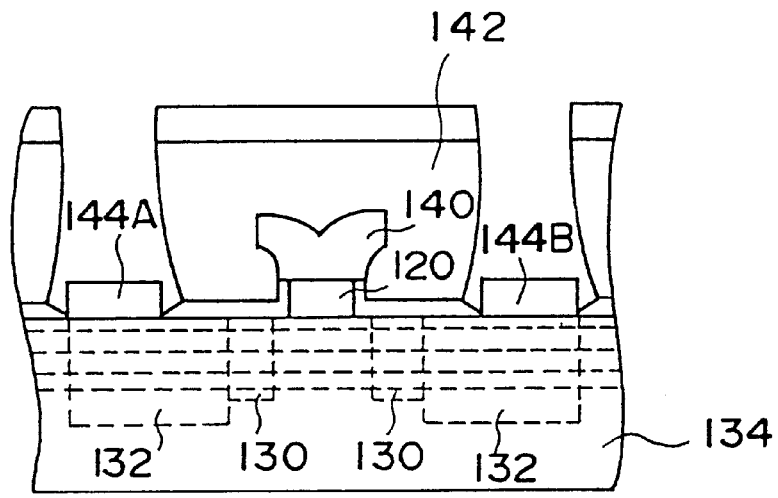
Figure 7H:
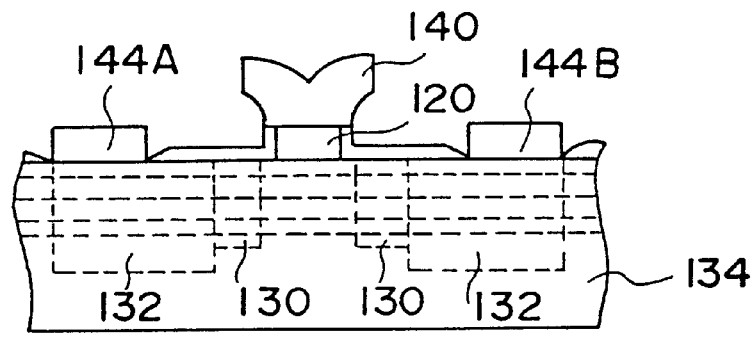
Figure 7I:
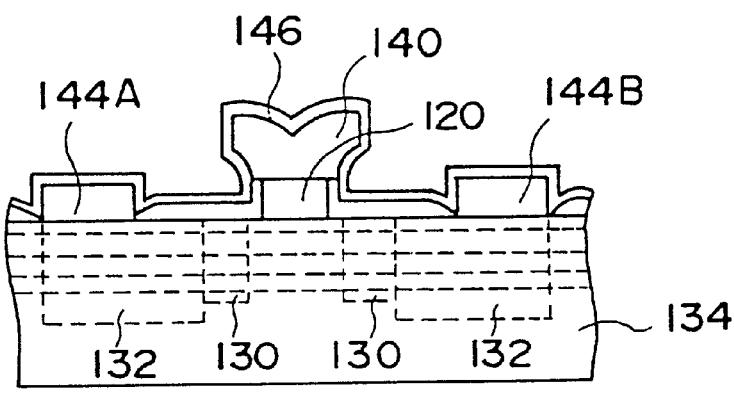

According to the present invention, the ohmic electrodes 160A and 160B are formed in the step of FIG. 8C before covering the surface of the substrate 156, and the process of forming a contact aperture in the passivation film covering the substrate surface as in the case of FIG. 7G can be omitted.

It should be noted that such a process of forming the ohmic electrodes 160A and 160B on the substrate 156 before protecting the substrate surface by a passivation film raises a problem of the surface of the substrate 156 may be damaged by the dry etching process in the step of FIG. 8B. The present embodiment avoids the problem of degradation of the device performance caused by such a damage, by forming the channel region 152 at a depth slightly deeper than in the case of a conventional MESFET by employing the acceleration voltage of 80 keV in the step of FIG. 8A. Thereby, the impurity ions thus injected reach a deeper depth in the substrate 156 as compared with the conventional case of using an acceleration voltage of about 40 keV.

[SIXTH EMBODIMENT]

FIGS. 9A–9D show the fabrication process of an air bridge structure according to a sixth embodiment of the present invention.

Figure 9A:
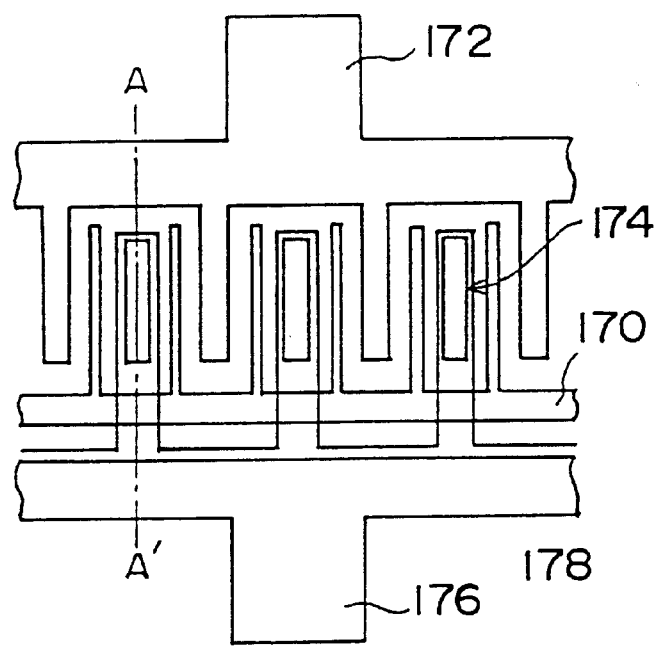
FIGS. 9A–9D are diagrams showing the fabrication process of a semiconductor device according to a sixth embodiment of the present invention.

Referring to FIG. 9A showing a typical FET having an interdigital gate electrode structure 170 in a plan view, it is practiced to use an air bridge structure for connecting a bonding pad 176 to a source electrode 174 both formed on a common substrate together with the interdigital gate electrode structure 170.

Figure 9B:
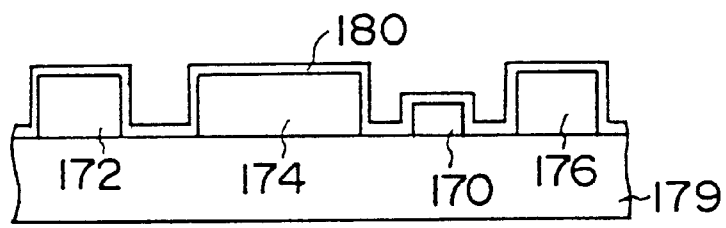
Figure 9C:
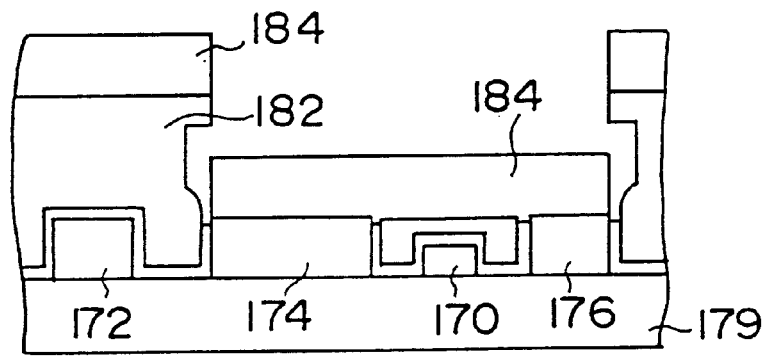
Figure 9D:
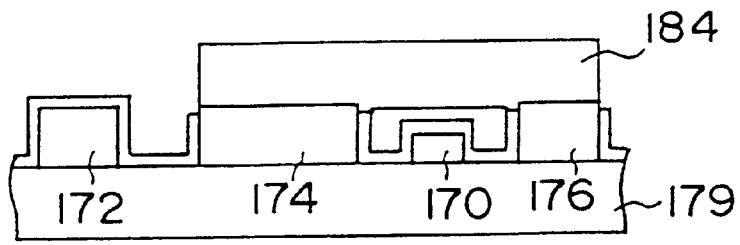

FIGS. 9B–9D show the process of forming such an air bridge structure in a cross-sectional view taken along a line A–A' of FIG. 9A.

Referring to FIG. 9B, ohmic electrodes 172, 174 and 176 are formed on a substrate 179 on which a gate electrode 170 is formed, wherein the ohmic electrodes 172, 174 and 176 are formed to have an increased height as compared with the gate electrode 170. Further, a passivation film 180 is deposited so as to cover the surface of the substrate 179 including the gate electrode 170 and the ohmic electrodes 172, 174 and 176.

Next, in the step of FIG. 9C, a photoresist layer 182 having a three-layer structure similar to the three-layer structure described before is deposited on the structure of FIG. 9B, followed by an exposure and developing process to form an opening in the photoresist layer such that the ohmic electrodes 174 and 176 are exposed. Thereby, it should be noted that the gate electrode 170 is covered by the lowermost, low-sensitivity layer of the three-layer photoresist 182 in the foregoing resist opening.

Further, the passivation film 180 is removed from the surface of the ohmic electrodes 174 and 176 thus exposed. Next, a metal layer 184 used for the air bridge structure is deposited on the photoresist layer 182 so as to include the resist opening by a vacuum evaporation process, wherein the metal layer 184 makes a contact with the ohmic electrodes 174 and 176 in the foregoing resist opening. In the present embodiment, a Au layer having a thickness of 3 $\mu$m is used for the metal layer 184.

After the step of FIG. 9C, the photoresist layer 182 is lifted off together with the metal layer 184 thereon, leaving behind the metal layer 184 forming the desired air bridge structure extending over the gate electrode 170. It should be noted that the lowermost photoresist layer covering the gate electrode 170 underneath the metal layer 184 is removed at the time of the lift-off process.

In the present embodiment, it should be noted that resist opening formed in the step of FIG. 9C has an increased lateral size due to the increased sensitivity of the second photoresist layer, wherein such an increased lateral size of the resist opening in the second photoresist layer facilitates the penetration of solvent when lifting off the photoresist resist layer 182 in the step of FIG. 9D.

[SEVENTH EMBODIMENT]

Figures 10D, 10E, 10F:
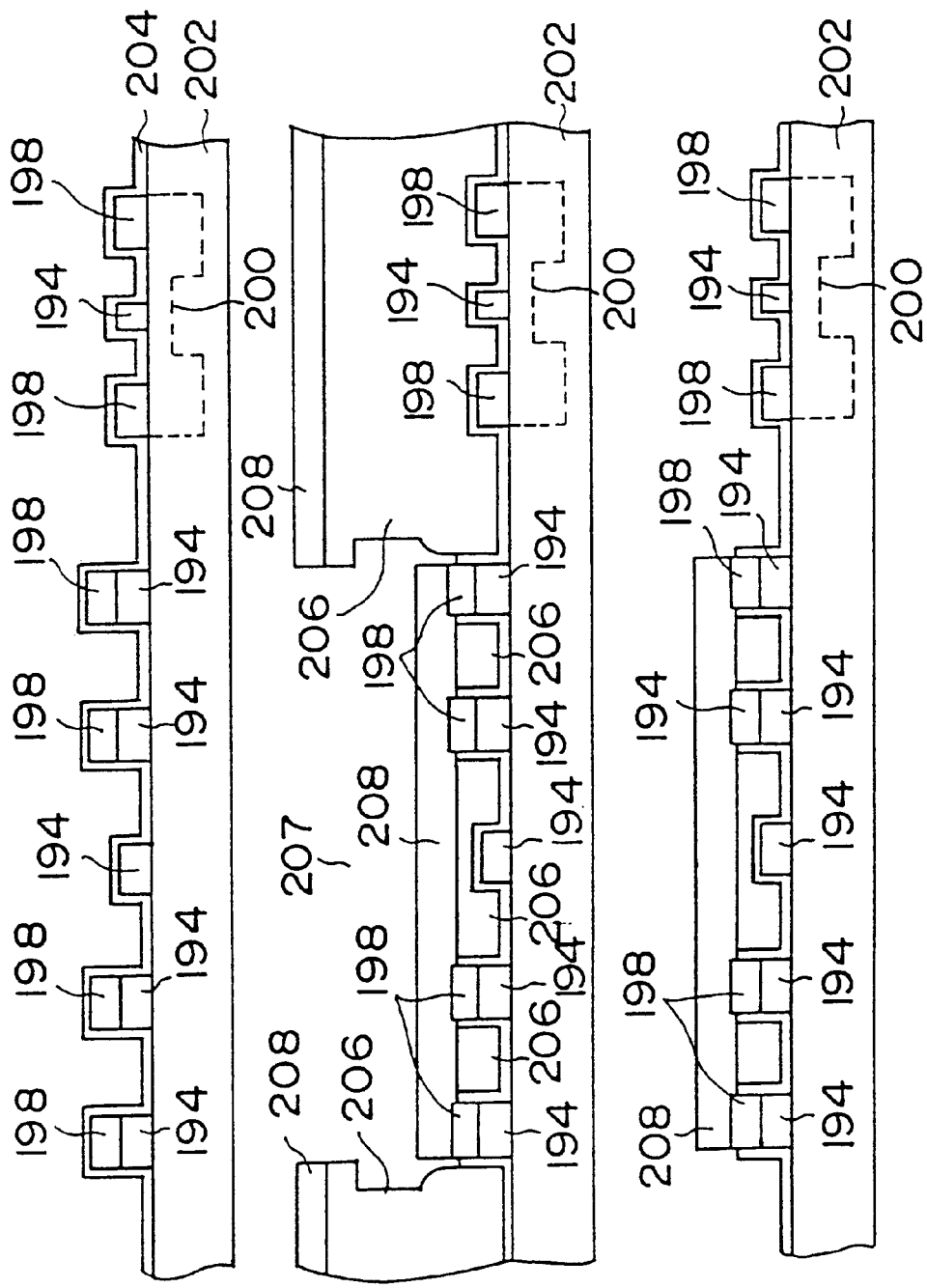

FIGS. 10A–10F show the fabrication process of a semiconductor device in which a spiral inductor having an air bridge structure is formed on a substrate commonly with an FET formed, wherein FIG. 10A shows the spiral inductor in a plan view.

Referring to FIG. 10A, it will be noted that the air bridge structure is used at a part 192 of the spiral inductor in which the spiral inductor crosses over a conductor pattern 186.

FIGS. 10B–10F show the fabrication process of the spiral conductor of FIG. 10A in a cross-sectional view taken along a line B–B' of FIG. 10A.

Referring to FIG. 10B, conductor patterns 194 are formed on a substrate 202 by a patterning process, wherein the conductor patterns 194 include a gate electrode of the FET and also the patterns used as a pillar of the air bridge structure.

In the step of FIG. 10C, the structure of FIG. 10B is buried under a photoresist layer 196, followed by a patterning process to form resist openings 195 such that each resist opening exposes a conductor pattern 194. Some of the resist openings 195 expose the surface of the substrate in which a diffusion region is formed. Further, a low-resistance metal layer 198 is deposited on the photoresist layer 196 including the resist openings 195 by a vacuum evaporation process such that a layer 198 of the low-resistance metal is formed on each of the conductor patterns 194. Simultaneously to the formation of the low-resistance layers 198, there are formed ohmic electrodes by the low-resistance metal layer 198 in ohmic contact with the substrate 202.

Next, in the step of FIG. 11D, the photoresist layer 196 is lifted off and a passivation film of SiN is formed on the structure thus obtained by a plasma CVD process, and a step of FIG. 10E is conducted in which a three-layer photoresist structure 206 similar to the three-layer photoresist structure of the second embodiment is deposited on the structure of FIG. 10D. Further, a resist opening 207 is formed in the photoresist structure 206 by an exposure process and a development process, such that the resist opening 207 exposes the conductor patterns 194 carrying thereon the low-resistance patterns 198 and used for supporting the air bridge structure. Further, a low-resistance metal layer 208 is deposited on the photoresist structure 206 including the resist opening 207 by a vacuum evaporation process with a thickness of about 3 μm, such that the low-resistance metal layer 208 bridges over the gate electrode 194 of the FET while being supported by the pillar conductor patterns 194 carrying thereon the low-resistance conductor patterns 198.

After lifting off of the photoresist structure 206 together with the low-resistance metal layer 208 thereon, an air bridge structure shown in FIG. 10F is obtained.

According to the present embodiment, it is possible to form the pillar structure supporting the air bridge structure without needing additional process steps. Thereby, the fabrication process of the air bridge structure is substantially simplified. The air bridge structure thus formed has an advantageous feature of flat top surface.

[EIGHTH EMBODIMENT]

FIGS. 11A–11H show the fabrication process of a semiconductor device according to an eighth embodiment of the present invention wherein a spiral inductor pattern is integrated with a bipolar transistor on a common substrate.

Referring to FIG. 11A, a substrate 212 carries thereon a collector layer 215, a base layer 213 and an emitter layer 211 stacked consecutively and epitaxially, wherein an emitter electrode 210 is provided on the emitter layer 211 in ohmic contact therewith.

Next, in the step of FIG. 11B, the emitter layer 211 is subjected to a dry etching process while using the emitter electrode 210 as a mask until the base layer 213 is exposed, and a base electrode 214 is formed on the base layer 213 thus exposed in the step of FIG. 11C.

Next, in the step of FIG. 11D, a plurality of photoresist patterns 216A are formed on the base layer 213 in correspondence to a part where a support pillar of the desired air bridge structure is to be formed. Further, a photoresist pattern 216 is formed so as to cover the region of the base layer 213 where the bipolar transistor is to be formed.

Figure 11E:
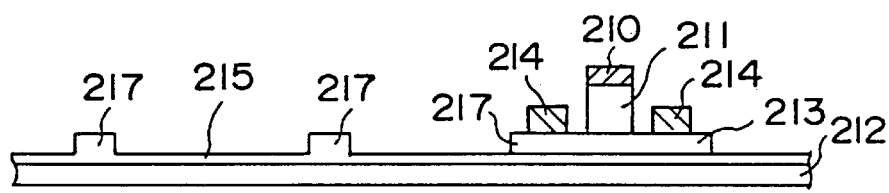

Next, in the step of FIG. 11E, the base layer 213 is subjected to a dry etching process while using the foregoing photoresist patterns 216A and 216B as a mask, until the collector layer 215 is exposed. As a dry etching process projections 217 are formed in the collector layer 215.

Figure 11F:
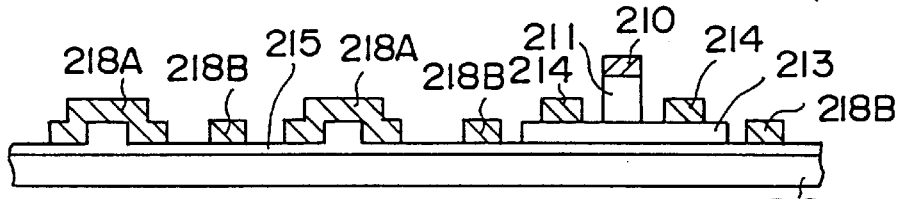

Next, in the step of FIG. 11F, pillar conductor patterns 218A are formed in correspondence to the foregoing projections 217 by a lift-off process. Simultaneously, collector electrodes 218B are formed on the collector layer 215 in correspondence to the region of the bipolar transistor.

Figure 11G:
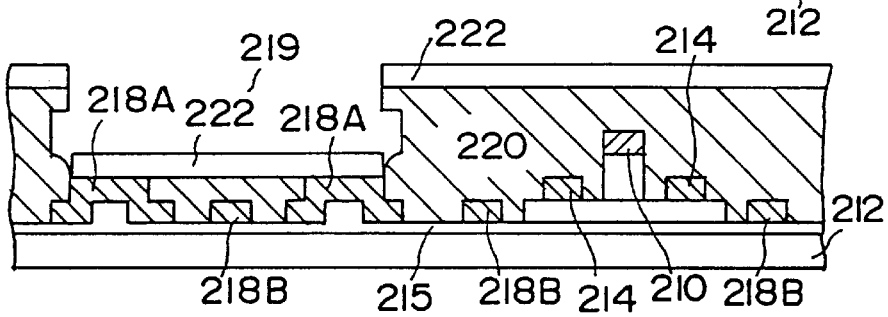
Figure 11H:
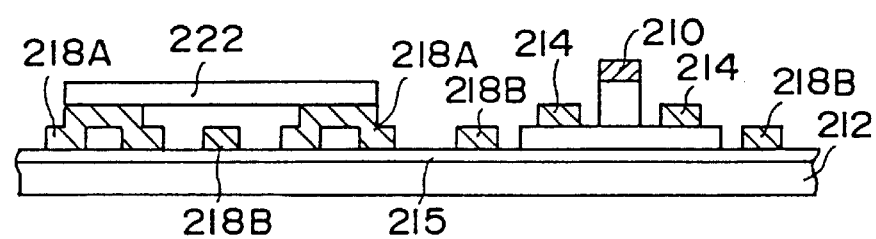

Next, in the step of FIG. 11G, a three-layer photoresist structure 220 similar to the three-layer photoresist structure of the first or second embodiment is provided on the structure of FIG. 11G, followed by an exposure and developing process in correspondence to the part where the air bridge structure is to be formed, and a low-resistance metal layer 222 is deposited on the photoresist structure 220 by a vacuum evaporation process including the resist opening formed as a result of the exposure and developing process.

After lifting off the photoresist structure 220 together with the low-melting metal layer 222 thereon, the low-resistance metal layer 222 in correspondence to the foregoing resist opening is remained as an air bridge structure.

The present embodiment demonstrates the fact that the process of the present invention is effective also for forming an air bridging structure in an integrated circuit including a bipolar transistor.

Further, the present invention is not limited to the embodiments described heretofore, but various variations and modifications may be made without departing from the scope of the invention.

It should be noted that present application is based on Japanese priority application No. 10-185142 filed on Jun. 30, 1998, the entire contents of which are hereby incorporated by reference.

What is claimed is:

1. A method of fabricating a semiconductor device, comprising the steps of:

forming a first photoresist layer on a surface of a substrate so as to cover a gate electrode formed on said surface of said substrate;

forming a second photoresist layer on said fist photoresist layer;

forming a third photoresist layer on said second photoresist layer;

forming an opening in a photoresist structure formed of said first through third photoresist layers such that said opening penetrates through said second and third photoresist layers, such that said opening has a diameter that increases gradually from said third photoresist layer to said second photoresist layer, such that said diameter of said opening increases gradually from said first photoresist layer to said second photoresist layer, and such that said opening exposes a top surface of said gate electrode; and depositing a metal layer having a resistance smaller than a resistance of said gate electrode on said photoresist structure so as to include said opening, such that said metal layer forms a low-resistance electrode on said gate electrode.

2. A method as claimed in claim 1, wherein said second photoresist layer has a sensitivity exceeding a sensitivity of any of said first and third photoresist layers.

3. A method as claimed in claim 1, further comprising the step of mixing said first photoresist layer and said second photoresist layer at a boundary between said first and second photoresist layers so as to form a transition region of sensitivity in the vicinity of said boundary.

4. A method as claimed in claim 1, further comprising the step of mixing said second photoresist layer and said third photoresist layer at a boundary between said second and third photoresist layers so as to form a transition region of sensitivity in the vicinity of said boundary.

5. A method as claimed in claim 1, wherein said second photoresist layer and said third photoresist layer have respective optimum wavelength for exposure, wherein said optimum wavelength for said second photoresist layer is different form said optimum wavelength for said third photoresist layer.

6. A method as claimed in claim 1, further including the step of conducting a thermal annealing process after forming said first photoresist layer.

7. A method as claimed in claim 1, further including the steps of: conducting a first exposure step after said step of forming said second photoresist layer; applying a mixing preventing agent on said second photoresist layer after said first exposure step; and conducting a second exposure step after a step of forming said third photoresist layer.

8. A method as claimed in claim 7, wherein said second exposure step uses a photomask having a mask window smaller in size than a photomask used in said first exposure step.

9. A method as claimed in claim 1, further including the steps of: depositing, after said step of depositing said metal layer, a first protective film such that said first protective film covers a surface of said metal layer and further a side wall of said gate electrode; forming an ohmic electrode on said substrate in ohmic contact therewith; and depositing a second protective film such that said second protective film covers said ohmic electrode and such that said second protective film covers said first protective film.

10. A method as claimed in claim 1, further including, before said step of forming said first photoresist layer, the steps of:
   introducing an impurity element into said substrate by an ion implantation process while using said gate electrode as a mask to form a diffusion region therein;
   forming an ohmic electrode on said diffusion region; and
   depositing a surface protective film on said substrate so as to cover said surface of said substrate including said ohmic electrode and said gate electrode,
   said photoresist structure being formed on said surface protective film,
   said method further including, after said step of forming said photoresist structure on said surface protective film, the steps of:
      forming said opening such that said opening exposes said surface protective film covering a top part of said gate electrode;
      removing said surface protective film exposed by said opening by an etching process; and
      forming said metal layer on said gate electrode.

11. A method as claimed in claim 10, further including, before said step of forming said first photoresist layer, the steps of:
   introducing an impurity element into said substrate while using said gate electrode as a mask, to form a diffusion region;
   depositing a surface protective film on said substrate so as to include a surface of said gate electrode and said diffusion region; and
   forming an ohmic electrode on said diffusion region;
   said photoresist structure being formed on said surface protective film covering said gate electrode.

12. A method of fabricating a semiconductor device, comprising the steps of:
   providing an insulation film on a surface of a substrate so as to cover a first conductor pattern formed on said surface of said substrate;
   applying a first photoresist layer on said surface of a substrate so as to cover said first conductor pattern;
   applying a second photoresist layer on said fist photoresist layer;
   applying a third photoresist layer on said second photoresist layer;
   forming an opening in a photoresist structure formed of said first through third photoresist layers such that said opening penetrates through said second and third photoresist layers, such that said opening has a diameter that increases gradually from said third photoresist layer to said second photoresist layer, such that said diameter of said opening increases gradually from said first photoresist layer to said second photoresist layer, and such that said opening exposes a top surface of said first conductor pattern; and
   depositing a metal layer having a resistance smaller than a resistance of said first conductor pattern on said photoresist structure so as to include said opening, such that said metal layer forms a second conductor pattern on said first conductor pattern,
   said step of providing said first photoresist layer being conducted such that said first photoresist layer covers said surface of said substrate in an intimate contact with a side wall of said first conductor pattern.

* * * * *